United States Patent
Ivanov et al.

(10) Patent No.: US 9,828,574 B2
(45) Date of Patent: Nov. 28, 2017

(54) CLEANING COMPOSITION AND METHOD FOR CLEANING SEMICONDUCTOR WAFERS AFTER CMP

(71) Applicant: Cabot Microelectronics Corporation, Aurora, IL (US)

(72) Inventors: Roman Ivanov, Aurora, IL (US); Fernando Hung, Aurora, IL (US); Cheng-Yuan Ko, New Taipei (TW); Fred Sun, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 82 days.

(21) Appl. No.: 14/993,837

(22) Filed: Jan. 12, 2016

(65) Prior Publication Data
US 2016/0201016 A1    Jul. 14, 2016

Related U.S. Application Data

(60) Provisional application No. 62/102,614, filed on Jan. 13, 2015.

(51) Int. Cl.
| | |
|---|---|
| *C11D 7/32* | (2006.01) |
| *C11D 11/00* | (2006.01) |
| *H01L 21/02* | (2006.01) |
| *C11D 7/06* | (2006.01) |

(52) U.S. Cl.
CPC .......... *C11D 11/0047* (2013.01); *C11D 7/06* (2013.01); *C11D 7/3209* (2013.01); *C11D 7/3218* (2013.01); *C11D 7/3281* (2013.01); *H01L 21/02074* (2013.01)

(58) Field of Classification Search
CPC ................................... C11D 11/0047
USPC ........................................... 510/175
See application file for complete search history.

(56) References Cited

U.S. PATENT DOCUMENTS

| 8,685,909 | B2 | 4/2014 | Angst et al. | |
| 2009/0130849 | A1* | 5/2009 | Lee | B24B 37/044 438/693 |
| 2012/0283163 | A1 | 11/2012 | Barnes et al. | |
| 2013/0157919 | A1* | 6/2013 | Mellies | H01L 21/02074 510/175 |

(Continued)

FOREIGN PATENT DOCUMENTS

| TW | 201404877 A | 2/2014 |
| TW | 201500542 A | 1/2015 |

(Continued)

OTHER PUBLICATIONS

Taiwan Intellectual Property Office, Search Report issued in connection with Taiwan Patent Application No. 105100975 dated Aug. 3, 2016.

(Continued)

*Primary Examiner* — Gregory E Webb
(74) *Attorney, Agent, or Firm* — Thomas Omholt; Erika S. Wilson; Salim A. Hasan

(57) ABSTRACT

The invention provides a composition for cleaning contaminants from semiconductor wafers following chemical-mechanical polishing. The cleaning composition contains one or more quaternary ammonium hydroxides, one or more organic amines, one or more metal inhibitors, and water. The invention also provides methods for using the cleaning composition.

19 Claims, 7 Drawing Sheets

(56) References Cited

U.S. PATENT DOCUMENTS

2014/0076365 A1    3/2014  Otake et al.
2015/0114429 A1*   4/2015  Jenq ................. H01L 21/02074
                                                              134/2

FOREIGN PATENT DOCUMENTS

WO    2013142250 A1    9/2013
WO    2013173743 A2   11/2013
WO    2014176193 A1   10/2014

OTHER PUBLICATIONS

Korean Intellectual Property Office, International Search Report issued in connection with International Patent Application No. PCT/US2016/013072 dated Apr. 29, 2016.

* cited by examiner

US 9,828,574 B2

CLEANING COMPOSITION AND METHOD FOR CLEANING SEMICONDUCTOR WAFERS AFTER CMP

BACKGROUND OF THE INVENTION

A semiconductor wafer is typically composed of a substrate, such as a silicon wafer, on which a plurality of transistors have been formed. Transistors are chemically and physically connected into a substrate and are interconnected through the use of well-known multilevel coplanar interconnects to form functional circuits. Typical multilevel interconnects are comprised of stacked thin-films consisting of, for example, one or more of the following: titanium (Ti), titanium nitrate (TiN), copper (Cu), aluminum (Al), tungsten (W), tantalum (Ta), cobalt (Co), ruthenium (Ru), or any combination thereof.

The traditional technique for forming functional multilevel coplanar interconnects has involved planarizing the surface of the interconnects via chemical-mechanical polishing (CMP). CMP involves the concurrent chemical and mechanical polishing of an overlying first layer to expose the surface of a non-planar second layer on which the first layer has been formed (see, e.g., U.S. Pat. Nos. 4,671,851; 4,910,155; 4,944,836; 6,592,776; 7,524,347; and 8,518,135).

CMP processes typically involve a polishing composition (also referred to as a polishing slurry) that contains abrasive particles, such as silica or alumina, in an acidic or basic solution. In a typical CMP process, a wafer is mounted upside down on a carrier in a CMP tool. A force pushes the carrier and the wafer downward toward a polishing pad. The carrier and the wafer are rotated above the rotating polishing pad on the CMP tool's polishing table. The polishing composition is then introduced between the rotating wafer and the rotating polishing pad during the polishing process.

Although conventional CMP processes are suitable for polishing, they tend to leave undesirable contaminants on the wafer surface. In particular, the wafer surface is often contaminated with remnants of the polishing composition, such as silica or alumina abrasive particles, and with metal ions from the polishing composition and from the material being polished. Such contaminants can have an adverse effect on semiconductor wafer performance. As a result, after a polishing composition is applied to the semiconductor surface, the polishing composition typically is washed from the wafer surface with an aqueous cleaning solution after CMP is completed (see, e.g., U.S. Pat. Nos. 4,051,057; 5,334,332; 5,837,662; 5,981,454; 6,395,693; and 6,541,434 and U.S. Patent Publication 2009/0130849).

Typical post-CMP cleaning compositions have not been fully satisfactory in cleaning semiconductor wafers. For example, it has been a challenge to obtain a cleaning solution that effects both low corrosion and good cleaning of material being polished. Accordingly, there remains a need in the art for a composition and/or method to effectively clean contaminants originating from the polishing composition, the polishing pad, and the material being polished from a semiconductor surface, while also minimizing corrosion. The invention seeks to provide such a semiconductor cleaning composition. These and other advantages of the invention will be apparent from the description of the invention provided herein.

BRIEF SUMMARY OF THE INVENTION

In one aspect, the invention provides a composition comprising: (a) one or more quaternary ammonium hydroxides in an amount effective to regulate the pH of the composition to a pH of from about 10 to about 14, (b) one or more organic amines, (c) one or more metal inhibitors selected from purines, azoles, pyrimidines, thiazoles, thiazolinones, polyphenols, barbituric acid derivatives, Schiff bases, and combinations thereof, and (d) water. The composition is suited for removing contaminants from semiconductor wafers following chemical-mechanical polishing.

In another aspect, the invention provides a cleaning method comprising (a) providing a semiconductor wafer having contaminants resulting from chemical-mechanical polishing of the semiconductor wafer and (b) contacting the surface of the semiconductor wafer with a cleaning composition in accordance with embodiments of the invention to remove at least some of the contaminants from the surface of the semiconductor wafer.

In another aspect, the invention provides a method for polishing and cleaning the surface of a semiconductor wafer comprising: (a) providing a polishing pad, a chemical-mechanical polishing composition, and a semiconductor wafer; (b) contacting the semiconductor wafer with the polishing pad and the polishing composition; (c) moving the polishing pad relative to a surface of the semiconductor wafer with the polishing composition therebetween to abrade the surface of the semiconductor wafer and thereby polish the surface of the wafer such that the polished surface of the wafer contains contaminants from the chemical-mechanical polishing composition; and (d) contacting the polished surface of the semiconductor wafer that contains contaminants with a cleaning composition in accordance with embodiments of the invention to remove at least some of the contaminants from the polished surface of the semiconductor wafer.

DETAILED DESCRIPTION OF THE INVENTION

Figure 1A:
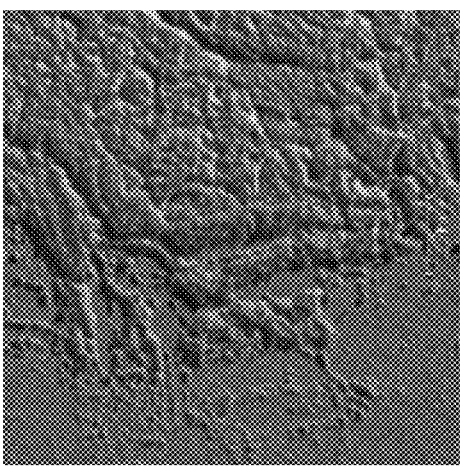
FIGS. 1A and 1B are scanning electron micrographs (SEMs) of semiconductor wafers at 12,500 times magnification illustrating corrosion defects.

Embodiments of the invention provide compositions and methods for cleaning contaminants from substrates, such as semiconductor wafers, following chemical-mechanical polishing ("CMP"). In particular, the cleaning compositions of the invention are suited for removing some or all of the contaminants that result from CMP systems as known in the art. For example, remnants from the polishing composition and process can result in debris that can be in the form of organic compounds, such as benzotriazole (BTA), silica, or other abrasive particles, surfactants, metal ions, polishing pad debris, CMP byproducts (e.g., metal ion adducts with organic ligands), or the like. These remnants and other contaminants are reduced in quantity or removed by use of the cleaning compositions disclosed herein.

Surprisingly and unexpectedly, it has been found that cleaning compositions in accordance with embodiments of the invention comprising a metal inhibitor in combination with a strong chelating agent in the form of an organic amine provide significantly improved cleaning ability, reduced post-CMP roughness, and lower metal (e.g., copper) loss from a semiconductor wafer than available cleaning compositions. In some embodiments, a quaternary ammonium hydroxide is included to regulate the pH of at least about 10 (e.g., from about 10 to 14), such that displaced ligands and other organic residue can be dissolved for optimal cleaning.

Without wishing to be bound by any particular theory, the organic amine is generally a strong chelating ligand with small functional groups characterized by its ability to displace or solubilize contaminants, such as BTA from metal-BTA adducts (e.g., copper-BTA adducts), on the substrate (e.g., wafer) surface, such that these contaminants can be dissolved during cleaning. Examples of suitable functional groups include $NH_2$—, alkyl-$NH$—, $SH$—, alkyl-SH, R—S—R, OH—, $PH_2$—, alkyl-PH—, and/or C=O, C=NH, C=N—R, C=N—OH, C=S, etc. To illustrate, contaminants, such as BTA concentrated on the metal (e.g., copper) surface, can form "islands," i.e., small localized areas on the metal surface consisting mostly of BTA with a small number of metal (e.g., copper) ions. Because these islands are relatively large, they can be difficult to remove. Embodiments of the invention are more effective at removing these islands in comparison with conventional cleaning compositions.

The invention encompasses aggressive and/or less aggressive organic amines, with suitable rate constants, in any suitable amount in various embodiments as described below. In some embodiments, one or more aggressive organic amine(s) is included, alone or in combination, with one or more less aggressive organic amine(s). In accordance with some embodiments, the inventors discovered that, surprisingly and unexpectedly, contrary to the belief in the art, a small amount (e.g., less than about 0.04 wt. %, such as less than about 0.03 wt. %, or less than about 0.01 wt. % when in a diluted form) of an aggressive organic amine in the presence of a metal inhibitor beneficially results in better cleaning capability with low defects and/or roughness.

The metal inhibitor is further believed to be characterized by its ability to prevent the dissolution of metal (e.g., copper) on the surface of the wafer, leaving only remnants from CMP and contaminants unprotected during cleaning. The metal inhibitor and the organic amine are believed to work together to effectively clean and protect the metal conductor surface, as the metal inhibitor serves to inhibit the metal surface from the undesired attack by an aggressive chemical (e.g., ammonium base, organic amine, oxygen, etc.), while the aggressive organic amine serves to displace organic compounds, such as BTA, and metal-organic compound adducts, such as Cu-BTA adducts, from metal-organic compound adducts. For ease of discussion, BTA or copper-BTA, at times, are referenced below as organic compounds or metal-organic adducts, respectively, but it will be understood that the discussion applies to any other organic compounds or metal-organic adducts unless otherwise indicated.

The quaternary ammonium hydroxide base is further believed to render abrasive particles on the metal oxide (e.g., copper oxide) surface of a semiconductor wafer more soluble, such that abrasive particles can be dissolved and/or removed during cleaning. The quaternary ammonium hydroxide negatively charges both the metal oxide (e.g., copper oxide) surface and abrasive particles thereon causing the abrasive particles to repel the surface and each other. It is believed that the higher pH of the cleaning composition allows for better particle removal due to a higher repulsion force between negatively charged abrasive particles and the negatively charged metal conductor surface.

Thus, the invention provides a cleaning composition as well as related methods of use. In some embodiments, the composition comprises, consists of, or consists essentially of (a) one or more quaternary ammonium hydroxides in an amount effective to regulate the pH of the composition to a pH of from about 10 to about 14, (b) one or more organic amines, (c) one or more metal inhibitors selected from purines, azoles, pyrimidines, thiazoles, thiazolinones, polyphenols, barbituric acid derivatives, Schiff bases (i.e., a compound with a functional group containing a carbon-nitrogen double bond with the nitrogen atom connected to an aryl or alkyl group), and combinations, and (d) water. The invention also provides a cleaning method and a method for polishing and cleaning the surface of a semiconductor wafer using the cleaning compositions of the invention.

Figure 1B:
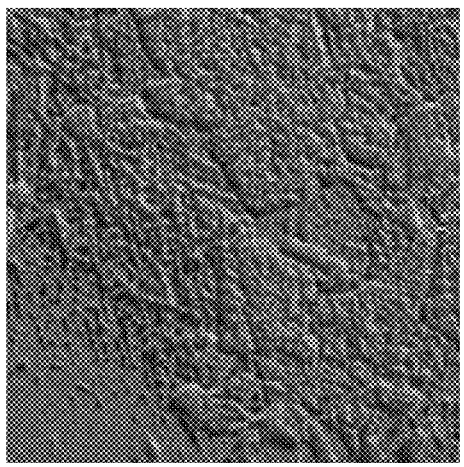
Figure 2A:
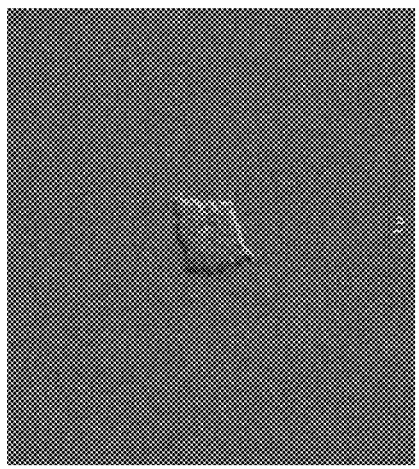
FIGS. 2A and 2B are SEMs of semiconductor wafers at 12,500 times magnification illustrating pit defects.
Figure 2B:
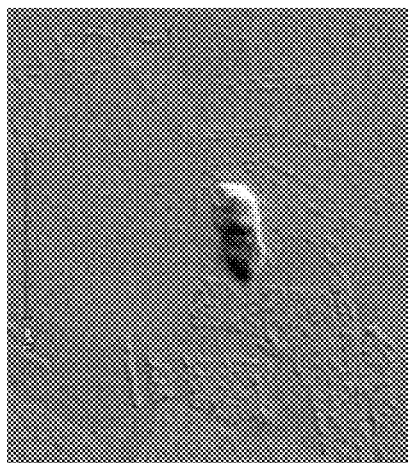

Surprisingly and unexpectedly, the inventive cleaning composition has been found to effectively clean substrates, such as semiconductor wafers. As will be appreciated by one of ordinary skill in the art, cleaning efficacy can be evaluated based on the visual observation of defects remaining on the wafer surface after post-CMP cleaning has occurred. Typically, cleaning related defects can be categorized into the following types: particle, particle aggregate, small organic residue, large organic residue, fall-on particles, corrosion, and pit. A particle is defined as a remnant from previous polishing. A particle aggregate is the number of groups of particles (i.e., two or more particles that are touching). Small organic residue accounts for residue that is less than one micron in size, while large organic residue accounts for residue that is greater than one micron. A fall-on particle is defined as a large particle of any shape. Fall-on particles may have precipitated on the wafer surface from air. They may also have been on the side of the opposite side of the wafer and due to a connection or movement went on the side of the wafer being polished. In either case, the number of fall-on particles is typically very low and may be removed with air. A corrosion defect, illustrated by the SEMs of FIGS. 1A and 1B, is high local roughness on the wafer surface. Pit defects, illustrated by the SEMs of FIGS. 2A and 2B, are small in area and considered deeper, more pronounced corrosion defects. Corrosion and pit defects negatively impact roughness in that they increase the average distance between the highest points and the lowest points on the substrate (e.g., wafer) surface.

Surprisingly and unexpectedly, it has been found that post-CMP cleaning of semiconductor wafers using compositions in accordance with embodiments of the invention results in a low total number of defects while also both avoiding, reducing, or eliminating post-CMP roughness and preventing the dissolution of the metal from which the metal conductors on the semiconductor wafer are formed. After post-CMP cleaning has taken place, it is desirable that the total number of defects remaining on the wafer surface is low, such as fewer than about 500 defects, e.g., fewer than about 450 defects, fewer than about 400 defects, fewer than about 350 defects, fewer than about 300 defects, fewer than about 250 defects, fewer than about 200 defects, fewer than about 150 defects, fewer than about 100 defects, or fewer than about 50 defects. Pit and corrosion defects are particularly undesirable for increasingly advanced technical nodes because metal conductor surface conductivity may drop as fast as exponentially with an increase in the number of corrosion defects of any kind. Embodiments of the present invention advantageously reduce the number of such pit and corrosion defects, such that low post-CMP roughness is facilitated. Thus, it is desirable that, in accordance with some embodiments of the invention, the number of corrosion and/or pit defects is fewer than about 10 defects, e.g., fewer than about 5 defects, fewer than about 2 defects, or fewer than about 1 defect.

Substrates Suitable for Cleaning

The cleaning composition of the invention has applicability with respect to a wide variety of semiconductor wafers used in fabrication of integrated circuits and other microdevices. Typically, the semiconductor wafer includes an insulator and a conducting agent. The cleaning composition of the invention can be used to clean substrates containing a variety of such insulators and conducting agents. For example, in some embodiments, copper can be a suitable conducting agent and silicon oxide (e.g., carbon doped) can be used as an insulator. Other layers can be included to include titanium nitride, tantalum nitride, or a reactive metal, such as cobalt metal, in order to enhance the interface between copper and, e.g., material having a relatively low dielectric constant relative to silicon dioxide, or other materials. It will be understood that the layers can be applied by any suitable method, such as chemical vapor deposition (CVD), physical vapor deposition (PVD), electroplating, etc. Following CMP, the use of the inventive cleaning composition desirably enhances conductivity by removing contaminants that would otherwise interfere with and hamper conductivity.

In some embodiments, the wafer is a semiconducting wafer comprising metal conductors. The metal conductors can be formed from any suitable metal. For example, in some embodiments, the metal conductors are formed from at least copper, tungsten, tantalum, cobalt, ruthenium, or any combination thereof. The semiconductor wafer can comprise a low-k dielectric material.

Cleaning compositions according to the invention can be tailored to the particular components of the wafer, based on the affinity of the materials on the wafer to various elements in the cleaning composition. A desired metal inhibitor in the cleaning composition as described herein can be selected depending on the metal to be protected. While not wishing to be bound by any particular theory, it has been found that according to the hard and soft (Lewis) acids and bases (HSAB) theory, copper generally prefers nitrogen over oxygen, while tungsten prefers oxygen. As further examples, cobalt has an affinity for oxygen and nitrogen; copper (I) has the highest affinity for sulfur and nitrogen and much less of an affinity for oxygen; and copper (II) has an affinity to oxygen and nitrogen, but much less of an affinity for sulfur. Accordingly, metal inhibitors containing such various elements can be selected in accordance with embodiments of the invention to address the desired metal.

The semiconductor wafers can be of conventional node configuration in some embodiments, e.g., technology nodes of 135 nm or less, 110 nm or less, 95 nm or less, 65 nm or less, 45 nm or less, 32 nm or less, etc. However, in some embodiments, the inventive cleaning composition is particularly suited for advanced node applications (e.g., technology nodes of 28 nm or less, 22 nm or less, 18 nm or less, 16 nm or less, 14 nm or less, 10 nm or less, etc.). It will be understood that, as node technology becomes more advanced, the absence of roughness and/or corrosion following CMP becomes more important because the effects of roughness and corrosion have an increased negative impact on conductivity as the relative size of features on the wafer gets smaller.

Because of the significant advancement that the inventive cleaning composition represents as compared with conventional cleaning compositions, the level of roughness and/or corrosion is reduced and more advanced node polishing can be achieved with better performance properties. For example, use of the inventive cleaning composition can allow enhanced conductivity on the semiconductor wafer in accordance with embodiments of the invention. It will be understood that roughness is the average distance between the highest points and the lowest points on the surface, usually measured in angstroms (Å). In some embodiments, use of the cleaning composition of the invention can result in a roughness of about 3 Å or less, e.g., about 2.5 Å or less, about 2 Å or less, etc., which is particularly useful for advanced node applications. However, as noted, the cleaning composition of the invention is not limited to use with advanced node wafers and can be used to polish other workpieces as desired.

The cleaning composition of the invention can be used to clean a workpiece, such as a semiconductor wafer, containing a variety of materials, characterized by any suitable dielectric constant relative to silicon dioxide. In some embodiments, at least a portion of the workpiece can include materials that can exhibit a relatively low dielectric constant relative to silicon dioxide, such as a low dielectric constant of about 3.5 or less (e.g., about 3 or less, about 2.5 or less, about 2 or less, about 1.5 or less, or about 1 or less). Such materials can include, for example, organic polymer film as known in the art or nano-porous low-k dielectric films (e.g., various BLACK DIAMOND™ products, commercially available from Applied Materials, Inc., Santa Clara, Calif.).

Alternatively, or in addition, at least a portion of the workpiece can include a material that can have a dielectric constant of about 1 or more (e.g., about 1.5 or more, about 2 or more, about 2.5 or more, about 3 or more, or about 3.5 or more), such as nano-porous film or organic polymer film. Thus, the workpiece can contain material having a dielectric constant bounded by any two of the foregoing endpoints. For example, the workpiece can contain a material having a dielectric constant between about 1 and about 3.5 (e.g., between about 2 and about 3, between about 2 and about 3.5, between about 2.5 and about 3, between about 2.5 and about 3.5).

Quaternary Ammonium Hydroxide

Any suitable quaternary ammonium hydroxide can be used in preferred embodiments so long as it is able to regulate the pH of the cleaning composition to at least about 10, e.g., from 10 to 14, as needed. Suitable examples or quaternary ammonium hydroxides include ethyltrimethylammonium hydroxide (ETMAH), diethyldimethylammonium hydroxide (DEDMAH), tetraethylammonium hydroxide (TEAM), tetrapropylammonium hydroxide (TPAH), tetrabutylammonium hydroxide (TBAH), tributylmethylammonium hydroxide, tripropylmethylammonium hydroxide, benzyltrimethylammonium hydroxide (BTMAH), trihydroxyethylmethylammonium hydroxide (THEMAH), or any combination thereof.

In some embodiments, the quaternary ammonium hydroxide is THEMAH. THEMAH is desirable in some embodiments because it is a readily available raw material and has been found to have chelating properties.

The quaternary ammonium hydroxide, such as THEMAH, can be present in any amount suitable to regulate the pH of the inventive cleaning composition to from about 10 to about 14. In some embodiments, the quaternary ammonium hydroxide is present in an amount that is from about 0.05 wt. % to about 40 wt. %, such as from about 0.1 wt. % to about 40 wt. %, from about 0.1 wt. % to about 0.2 wt. %, from about 0.2 wt. % to about 5 wt. %, from about 5 wt. % to about 10 wt. %, from about 10 wt. % to about 20 wt. %, from about 20 wt. % to about 25 wt. %, or from about 25 wt. % to about 40 wt. %. For example, in some embodiments, the quaternary ammonium hydroxide is in an amount of from about 0.05 wt. % to about 0.2 wt. % when in a diluted form. Additionally, in some embodiments, the quaternary ammonium hydroxide is in an amount of from about 2.5 wt. % to about 10 wt. % when in a concentrated form (e.g., a 50 times concentrate). In further embodiments in which the quaternary ammonium hydroxide is in concentrated form, the quaternary ammonium hydroxide is in an amount of from about 10 wt. % to about 40 wt. % (e.g., a 200 times concentrate).

It will be understood that, generally, the actual quantity of one or more ingredient in compositions in accordance with embodiments of the invention (e.g., one or more quaternary ammonium hydroxide(s), one or more organic amine(s), one or more metal inhibitor(s), and/or one or more dialkylhydroxylamines or inorganic or organic acid salts thereof) may vary depending on the desired degree of dilution or concentration. In this respect, some embodiments can be packaged in the form of a concentrate (e.g., a 50 times concentrate, a 100 times concentrate, a 200 times concentrate, etc.) where water can be later added to dilute the solution, such as at a point of use (e.g., by an end user), or the solution can be packaged in a diluted form with water already included. For example, in some embodiments, the concentrated forms of each ingredient and/or the solution as a whole can facilitate ease of shipping, distribution, and sale. However in other embodiments, each ingredient and/or the solution as a whole can be in a diluted form, e.g., to simplify end use. Thus, the weight ranges as described herein and throughout for the aforementioned ingredients can refer to either the diluted or concentrated ranges.

Accordingly, each ingredient can be present in a diluted form that is suitable for end use or in a form that is concentrated and then diluted (e.g., 2 times, 5 times, 10 times, 25 times, 40 times, 50 times, 60 times, 70 times, 100 times, 125 times, 150 times, 175 times, 200 times, etc. to the diluted form). When the concentrate is diluted with an equal volume of water (e.g., 1 equal volumes water, 4 equal volumes of water, 9 equal volumes of water, 24 equal volumes of water, 39 equal volumes of water, 49 equal volumes of water, 59 equal volumes water, 69 equal volumes of water, 99 equal volumes of water, 124 equal volumes of water, 149 equal volumes of water, 174 equal volumes of water, or 199 equal volumes of water, respectively), each ingredient will be present in embodiments of the invention in an amount within the diluted ranges set forth below for each component. Furthermore, as will be understood by those of ordinary skill in the art, the concentrate can contain an appropriate fraction of the water present in the final solution. For example, in some applications, e.g., cleaning compositions, the concentrate can contain an appropriate fraction of the water present in the final cleaning composition in order to ensure that the compound or compounds that increases the generation of low final metal surface roughness, corrosion, and/or the effective removal of contaminants, such as abrasive particles, metal ions, and other residues as discussed herein, are at least partially or fully dissolved in the concentrate.

In some embodiments, the quaternary ammonium hydroxide is present in a diluted form in an amount that is from about 0.05 wt. % to about 0.2 wt. %, e.g., from about 0.05 wt. % to about 0.18 wt. %, from about 0.05 wt. % to about 0.16 wt. %, from about 0.05 wt. % to about 0.14 wt. %, from about 0.05 wt. % to about 0.12 wt. %, from about 0.05 wt. % to about 0.1 wt. %, from about 0.05 wt. % to about 0.08 wt. %, from about 0.08 wt. % to about 0.2 wt. %, from about 0.08 wt. % to about 0.18 wt. %, from about 0.08 wt. % to about 0.16 wt. %, from about 0.08 wt. % to about 0.14 wt. %, from about 0.08 wt. % to about 0.12 wt. %, from about 0.08 wt. % to about 0.1 wt. %, from about 0.1 wt. % to about 0.2 wt. %, from about 0.1 wt. % to about 0.18 wt. %, from about 0.1 wt. % to about 0.16 wt. %, from about 0.1 wt. % to about 0.14 wt. %, from about 0.1 wt. % to about 0.12 wt. %, from about 0.12 wt. % to about 0.2 wt. %, from about 0.12 wt. % to about 0.18 wt. %, from about 0.12 wt. % to about 0.16 wt. %, from about 0.12 wt. % to about 0.14 wt. %, from about 0.14 wt. % to about 0.2 wt. %, from about 0.14 wt. % to about 0.18 wt. %, or from about 0.14 wt. % to about 0.16 wt. %.

In some embodiments, the quaternary ammonium hydroxide is present in a concentrated form (e.g., a 50 times concentrate) in an amount that is from about 2.5 wt. % to about 10 wt. %, e.g., from about 2.5 wt. % to about 9 wt. %, from about 2.5 wt. % to about 8 wt. %, from about 2.5 wt. % to about 7 wt. %, from about 2.5 wt. % to about 6 wt. %, from about 2.5 wt. % to about 5 wt. %, from about 5 wt. % to about 10 wt. %, from about 5 wt. % to about 9 wt. %, from about 5 wt. % to about 8 wt. %, from about 5 wt. % to about 7 wt. %, from about 5 wt. % to about 6 wt. %, from about 6 wt. % to about 10 wt. %, from about 6 wt. % to about 9 wt. %, from about 6 wt. % to about 8 wt. %, from about 6 wt. % to about 7 wt. %, from about 7 wt. % to about 10 wt. %, from about 7 wt. % to about 9 wt. %, from about 7 wt. % to about 8 wt. %, from about 8 wt. % to about 10 wt. %, from about 8 wt. % to about 9 wt. %, or from about 9 wt. % to about 10 wt. %.

In some embodiments, the quaternary ammonium hydroxide is present in a concentrated form (e.g., a 200 times concentrate) in an amount that is from about 10 wt. % to about 40 wt. %, e.g., from about 10 wt. % to about 35 wt. %, from about 10 wt. % to about 30 wt. %, from about 10 wt. % to about 25 wt. %, from about 10 wt. % to about 20 wt. %, from about 10 wt. % to about 15 wt. %, from about 20 wt. % to about 40 wt. %, from about 20 wt. % to about 35 wt. %, from about 20 wt. % to about 30 wt. %, from about 20 wt. % to about 25 wt. %, from about 25 wt. % to about 40 wt. %, from about 25 wt. % to about 35 wt. %, from about 25 wt. % to about 30 wt. %, from about 30 wt. % to about 40 wt. %, from about 30 wt. % to about 35 wt. %, or from about 35 wt. % to about 40 wt. %.

The cleaning composition of the invention generally has a pH of at least about 10 (e.g., from about 10 to about 14). In preferred embodiments, the pH of the cleaning composition is from about 10 to about 13, e.g., from about 10 to about 12, from about 10 to about 11, from about 11 to about 13, from about 11 to about 12, or from about 12 to about 13. Without wishing to be bound by any particular theory, it is believed that a high concentration of the quaternary ammonium hydroxide(s) leads to improved cleaning ability in some embodiments. A high pH is believed to be desirable to, e.g., facilitate dissolution of organic compounds, such as BTA that is displaced form the metal-BTA adducts (e.g., copper-BTA adducts). It is also believed that the high pH imparts a negative charge on the wafer surface (including the conducting agent and insulator) and on abrasive particles, causing them to repel each other. A negative surface charge increases the hydrophilicity of the wafer surface thereby preventing re-precipitation of organic-containing (e.g., BTA) by-products on the insulator surface and improving surface wetting (hydrophilicity).

Organic Amine

Any suitable organic amine can be used in embodiments of the invention. In preferred embodiments, the organic amine is a strong chelating ligand, characterized by its ability to form stable complexes with a metal ion and to displace other ligands. The strong chelating ligand in the form of an organic amine generally has a high chelating effect, atoms with a very high electron density donating ability (e.g., nitrogen, phosphorus, sulfur, and oxygen), and a small size or geometrical factor.

The organic amine can have any suitable rate constant, such that it allows for good cleaning ability (e.g., the amine's ability to displace BTA or solubilize metal-BTA adducts) and generates low corrosion. In some embodiments, an organic amine with a generally high rate constant can be desirable. A generally high rate constant indicates a fast reacting ligand and a strong ligand for a metal ion under the relevant conditions of temperature, pressure, pH, etc., whereas a generally low rate constant indicates a slower reacting ligand and thus a weak ligand. To illustrate, in accordance with embodiments of the invention, Cu has affinity for nitrogen, such that ethylenediamine (En) will be a strong ligand with a high rate constant, while Cu(I) does not have affinity for oxygen, such that monoethanolamine (MEA) will be weaker than En and MEA's rate constant will be several orders of magnitude lower. Thus, a high rate constant characterizes an aggressive organic amine (e.g., En and propylenediamine (Pn)). While not wishing to be bound by any particular theory, it is believed that a generally high rate constant facilitates the aggressive organic amine's ability to dissolve particular metals, metal salts, hydroxides, oxides, and metal adducts with other organic and inorganic ligands.

In some embodiments, an organic amine with a relatively lower rate constant can be desirable. A relatively lower rate constant characterizes a less aggressive organic amine (e.g., MEA). It is further believed that an organic amine having a relatively lower rate constant, i.e., a less aggressive organic amine, can be desirable in some embodiments to generate a reduced post-CMP roughness. In some embodiments, to achieve a balance of cleaning and low corrosion, a combination of aggressive organic amine and less aggressive organic amine can be used in the amounts described herein. It will be understood that the use of the singular for organic amine herein, as with other components (e.g., quaternary ammonium hydroxide, etc.) defined herein, will encompass more than one.

While not wishing to be bound by any particular theory, it is believed that the rate constant, reaction rate, and concentration of a given organic amine are associated with its ability to clean a substrate and generate low roughness after CMP has taken place. Reaction rate describes how fast an organic amine displaces an organic compound (such as BTA) or attaches to metal-organic adducts (e.g., copper-BTA adducts) and transports the metal-organic to the solution from the polymeric metal-organic compound adduct. Reaction rate is proportional to rate constant and the amine concentration. Thus, the higher the amine concentration is, the higher the reaction rate is. It is further believed that when comparing two organic amines, it can be particularly useful to consider their rate constants and, in some embodiments, even more so than their reaction rates and concentrations. For example, the rate constant of an aggressive organic amine could be several orders of magnitude higher (e.g., 5-10 orders) than that of an organic amine that is relatively less aggressive.

In some embodiments where an aggressive organic amine is desirable, it is believed that a small amount of an aggressive organic amine allows for ligand (e.g., BTA) displacement due to its reaction rate and rate constant. Cleaning ability is, thus, believed to be improved in embodiments of the invention including an aggressive organic amine. In various embodiments, an aggressive organic amine, even in a lower concentration (e.g., 10 times lower), will react faster and be able to remove more contaminants in the same period of time (e.g., 30-60 seconds) than a less aggressive organic amine. Among examples of aggressive organic amines (e.g., those with a generally high rate constant) that can be used in accordance with embodiments of the invention are aminoethylethanolamine (aminoethylaminoethanol, AEAE), N,N'-bis(2-hydroxyethyl)ethylenediamine), N,N'-di-tert-butylethylenediamine, N,N'-diethylethylenediamine, En, Pn, and N-ethylethylenediamine.

Furthermore, in some embodiments where a less aggressive organic amine is desirable, the ability to achieve a similar cleaning ability as embodiments of the invention including a more aggressive organic amine can be limited by the chemical properties of the less aggressive organic amine. While cleaning ability can be improved with increased amounts of a less aggressive organic amine, the amount of less aggressive organic amine required to facilitate comparable cleaning ability would spatially limit the desired quantities of other components (e.g., the quaternary ammonium hydroxide).

However, while embodiments of the invention including a less aggressive organic amine are believed to be less effective with regards to cleaning ability, it is also believed that these embodiments can generate desirably low post-CMP roughness in comparison to embodiments including an aggressive organic amine. Therefore, in accordance with some embodiments, a less aggressive organic amine can be included in order to limit post-CMP roughness, alone or in combination with an aggressive organic amine. In further embodiments, lower amounts of an aggressive organic amine are preferred for a balance of good cleaning ability and lower post-CMP roughness.

Suitable examples of the strong chelating ligand include, but are not limited to, diethanolamine (DEA), triethanolamine (TEA), methyl diethanolamine (MDEA), aminoethylethanolamine (aminoethylaminoethanol, AEAE), triethanolamine, diethanolamine, 2-amino-2-methyl-1-propanol, 3-amino-1-propanol, 2-dimethylamino-2-methylpropanol, 2-methylaminoethanol, 1-amino-2-propanol, 2-(2-dimethylamino)ethyl)methylamino)ethanol, N,N'-bis(2-hydroxyethyl)ethylenediamine), 2-(tert-butylamino)ethanol, 2-dimethylaminoethanol, 2-aminophenol, 1-amino-2-propanol, cysteamine, glycine, diethylenetriamine, pentaethylenehexamine, N,N'-di-tert-butylethylenediamine, N,N'-diethylethylenediamine, ethylenediamine (En), 1,2-diaminopropane (Pn), N-ethylethylenediamine, monoethanolamine (MEA), diglycolamine (DGA), or a combination thereof. Other organic amines with high chelating effect, atoms with a very high electron density donating ability, and a small size or geometrical factor will be readily apparent to one of ordinary skill in the art.

In some embodiments, the organic amine is ethylenediamine (En), 1,2-diaminopropane (Pn), aminoethylaminoethanol (AEAE), N-ethylethylenediamine, monoethanolamine (MEA), diglycolamine (DGA), or a combination thereof. For example, in some embodiments, the organic amine is ethylenediamine (En). In other embodiments, the organic amine is 1,2-diaminopropane (Pn) or a combination of En and Pn. In further embodiments, the organic amine is monoethanolamine (MEA).

Without wishing to be bound by any particular theory, it is believed that in some embodiments, the strong chelating ligand in the form of an organic amine is in an amount effective to remove organic residues from metal (e.g., copper) surfaces. In some embodiments, the strong chelating ligand in the form of an organic amine is in an amount effective to displace BTA from metal-BTA adducts (e.g., copper-BTA adducts). It is further believed that the strong chelating ligand in the form of an organic amine is in an amount effective to solubilize metal-BTA adducts and create water soluble mixed ligand complexes (e.g., $(amine)_x$-Cu-$(BTA)_y$). In order to effectively interact with metal-BTA (e.g., copper-BTA), it is believed that the strong chelating ligand cannot be so large that there is not enough space to displace BTA and/or to create a soluble mixed ligand complex by reaching the central metal ion. The strong chelating ligand should be able to position itself in front of BTA to displace it.

The aggressive organic amine and less aggressive organic amine, alone or in combination, can be present in any suitable amounts. In some embodiments, the organic amine can be present in an amount that is from about 0.002 wt. % to about 20 wt. %. The diluted forms will be at the lower end of this range and the concentrated forms will be at the higher end of this range in some embodiments. In addition, in some embodiments, the more aggressive organic amines will be in amounts at the lower end of the range while the less aggressive organic amines may be at the higher end of the range. For example, the organic amine can be present in an amount of from about 0.002 wt. % to about 15 wt. %, such as from about 0.002 wt. % to about 10 wt. %, from about 0.002 wt. % to about 5 wt. %, or from about 0.002 wt. % to about 1 wt. %.

For example, in some embodiments, the aggressive organic amine can be in an amount of from about 0.002 wt. % to about 0.1 wt. % when in a diluted form. In concentrated form, the amount may vary depending on the degree of concentration. For example, in a 50 times concentrate, the aggressive organic amine can be present in an amount of from about 0.1 wt. % to about 5 wt. %, or in a 200 times concentrate in an amount of from about 0.4 wt. % to about 20 wt. %.

In some embodiments, the aggressive organic amine can be present in a diluted form in an amount that is from about 0.002 wt. % to about 0.1 wt. %, e.g., from about 0.002 wt. % to about 0.08 wt. %, from about 0.002 wt. % to about 0.05 wt. %, from about 0.002 wt. % to about 0.4 wt. %, from about 0.002 wt. % to about 0.03 wt. %, from about 0.002 wt. % to about 0.3 wt. %, from about 0.002 wt. % to about 0.01 wt. %, from about 0.002 wt. % to about 0.008 wt. %, from about 0.002 wt. % to about 0.005 wt. %, from about 0.005 wt. % to about 0.1 wt. %, from about 0.005 wt. % to about 0.08 wt. %, from about 0.003 wt. % to about 0.4 wt. %, from about 0.005 wt. % to about 0.05 wt. %, from about 0.005 wt. % to about 0.03 wt. %, from about 0.002 wt. % to about 0.2 wt. %, from about 0.005 wt. % to about 0.01 wt. %, from about 0.005 wt. % to about 0.008 wt. %, from about 0.01 wt. % to about 0.1 wt. %, from about 0.01 wt. % to about 0.08 wt. %, from about 0.01 wt. % to about 0.05 wt. %, from about 0.01 wt. % to about 0.4 wt. %, from about 0.01 wt. % to about 0.03 wt. %, or from about 0.002 wt. % to about 0.2 wt. %.

In some embodiments, the aggressive organic amine can be present in a concentrated form (e.g., a 50 times concentrate) in an amount that is from about 0.1 wt. % to about 5 wt. %, e.g., from about 0.1 wt. % to about 4 wt. %, from about 0.1 wt. % to about 3 wt. %, from about 0.1 wt. % to about 2 wt. %, from about 0.1 wt. % to about 1 wt. %, from about 0.1 wt. % to about 0.5 wt. %, from about 0.5 wt. % to about 5 wt. %, from about 0.5 wt. % to about 3 wt. %, from about 0.5 wt. % to about 2 wt. %, from about 0.5 wt. % to about 1 wt. %, from about 1 wt. % to about 5 wt. %, from about 1 wt. % to about 4 wt. %, from about 1 wt. % to about 3 wt. %, or from about 1 wt. % to about 2 wt. %.

In some embodiments, the aggressive organic amine is present in a concentrated form (e.g., a 200 times concentrate) in an amount that can be from about 0.4 wt. % to about 20 wt. %, e.g., from about 0.4 wt. % to about 15 wt. %, from about 0.4 wt. % to about 12 wt. %, from about 0.4 wt. % to about 10 wt. %, from about 0.4 wt. % to about 9 wt. %, from about 0.4 wt. % to about 8 wt. %, from about 0.4 wt. % to about 7 wt. %, from about 0.4 wt. % to about 6 wt. %, from about 0.4 wt. % to about 5 wt. %, from about 0.5 wt. % to about 20 wt. %, from about 0.5 wt. % to about 15 wt. %, from about 0.5 wt. % to about 12 wt. %, from about 0.5 wt. % to about 10 wt. %, from about 0.5 wt. % to about 9 wt. %, from about 0.5 wt. % to about 8 wt. %, from about 0.5 wt. % to about 7 wt. %, from about 0.5 wt. % to about 6 wt. %, from about 0.5 wt. % to about 5 wt. %, from about 1 wt. % to about 20 wt. %, from about 1 wt. % to about 15 wt. %, from about 1 wt. % to about 12 wt. %, from about 1 wt. % to about 10 wt. %, from about 1 wt. % to about 9 wt. %, from about 1 wt. % to about 8 wt. %, from about 1 wt. % to about 7 wt. %, from about 1 wt. % to about 6 wt. %, from about 1 wt. % to about 5 wt. %, from about 2 wt. % to about 20 wt. %, from about 2 wt. % to about 15 wt. %, from about 2 wt. % to about 12 wt. %, from about 2 wt. % to about 10 wt. %, from about 2 wt. % to about 9 wt. %, from about 2 wt. % to about 8 wt. %, from about 2 wt. % to about 7 wt. %, from about 2 wt. % to about 6 wt. %, or from about 2 wt. % to about 5 wt. %.

In embodiments of the invention including a less aggressive organic amine, the less aggressive organic amine can be present in an amount of from about 0.12 wt. % to about 0.4 wt. % when in a diluted form. In concentrated form, the amount may vary depending on the degree of concentration. For example, in a concentrate (e.g., a 50 times concentrate, 100 times concentrate, or a 200 times concentrate), the less aggressive organic amine can be present in an amount of from about 6 wt. % to about 20 wt. %.

In some embodiments, the less aggressive organic amine is present in a diluted form in an amount that is from about 0.12 wt. % to about 0.4 wt. %, e.g., from about 0.12 wt. % to about 0.35 wt. %, from about 0.12 wt. % to about 0.3 wt. %, from about 0.12 wt. % to about 0.25 wt. %, from about 0.12 wt. % to about 0.2 wt. %, from about 0.12 wt. % to about 0.18 wt. %, from about 0.12 wt. % to about 0.16 wt. %, from about 0.12 wt. % to about 0.14 wt. %, 0.14 wt. % to about 0.4 wt. %, from about 0.14 wt. % to about 0.35 wt. %, from about 0.14 wt. % to about 0.3 wt. %, from about 0.14 wt. % to about 0.25 wt. %, from about 0.14 wt. % to about 0.2 wt. %, from about 0.14 wt. % to about 0.18 wt. %, from about 0.14 wt. % to about 0.16 wt. %, 0.16 wt. % to about 0.4 wt. %, from about 0.16 wt. % to about 0.35 wt. %, from about 0.16 wt. % to about 0.3 wt. %, from about 0.16 wt. % to about 0.25 wt. %, from about 0.16 wt. % to about 0.2 wt. %, from about 0.16 wt. % to about 0.18 wt. %, 0.18 wt. % to about 0.4 wt. %, from about 0.18 wt. % to about 0.35 wt. %, from about 0.18 wt. % to about 0.3 wt. %, from about 0.18 wt. % to about 0.25 wt. %, or from about 0.18 wt. % to about 0.2 wt. %.

In some embodiments, the less aggressive organic amine is present in a concentrated form (e.g., a 50 times concentrate, a 100 times concentrate, or a 200 times concentrate) in an amount that is from about 6 wt. % to about 20 wt. %, e.g., from about 6 wt. % to about 18 wt. %, from about 6 wt. % to about 15 wt. %, from about 6 wt. % to about 12 wt. %, from about 6 wt. % to about 10 wt. %, from about 6 wt. % to about 9 wt. %, from about 6 wt. % to about 8 wt. %, from about 6 wt. % to about 7 wt. %, from about 7 wt. % to about 20 wt. %, from about 7 wt. % to about 18 wt. %, from about 7 wt. % to about 15 wt. %, from about 7 wt. % to about 12 wt. %, from about 7 wt. % to about 10 wt. %, from about 7 wt. % to about 9 wt. %, from about 7 wt. % to about 8 wt. %, from about 8 wt. % to about 20 wt. %, from about 8 wt. % to about 18 wt. %, from about 8 wt. % to about 15 wt. %, from about 8 wt. % to about 12 wt. %, from about 8 wt. % to about 10 wt. %, from about 8 wt. % to about 9 wt. %, from about 9 wt. % to about 20 wt. %, from about 9 wt. % to about 18 wt. %, from about 9 wt. % to about 15 wt. %, from about 9 wt. % to about 12 wt. %, from about 9 wt. % to about 10 wt. %, from about 10 wt. % to about 20 wt. %, from about 10 wt. % to about 18 wt. %, from about 10 wt. % to about 15 wt. %, from about 10 wt. % to about 12 wt. %, from about 11 wt. % to about 20 wt. %, from about 11 wt. % to about 18 wt. %, from about 11 wt. % to about 15 wt. %, or from about 11 wt. % to about 12 wt. %.

In some embodiments, it is desirable that the strong chelating ligand is small and aggressive organic amine to allow for BTA displacement and/or mixed ligand complex formation and effective cleaning. In some embodiments, it is desirable that the strong chelating ligand comprises a less aggressive organic amine (alone or in combination with an aggressive organic amine) for the purposes of generating low post-CMP roughness.

Metal Inhibitor

Any suitable metal inhibitor can be used in embodiments of the invention. The metal inhibitor serves to protect metals typically found on a semiconductor wafer by interacting with the metal surface. This interaction can be rendered as either chemical binding to the metal (e.g., copper) or physically absorbing to the metal surface (e.g., copper). The inventors have found that effective metal inhibitors not only protect the metal (e.g., copper) surface from corrosion but also contribute in removal of organic residues (e.g., by displacing BTA from metal-BTA adducts), which results in further improved cleaning ability of a cleaning formulation, in accordance with embodiments of the invention.

In accordance with some embodiments, the metal inhibitor can be selected from purines, azoles, pyrimidines, thiazoles, thiazolinones, polyphenols, barbituric acid derivatives, Schiff bases, or any combination thereof.

The metal inhibitor of some embodiments is a purine selected from guanine, xanthine, hypoxanthine, theophylline, paraxanthine, theobromine, caffeine, uric acid, adenosine, guanosine, or any combination thereof.

In some embodiments, the metal inhibitor is an azole selected from 3-amino-5-methylpyrazole (3-AMP), 3-amino-1,2,4-triazole (3-ATA), 5-aminotetrazole (5-ATA), 3,5-diamino-1,2,4-triazole (3,5-ATA or guanazole), 1,2,4-triazole (TAZ), 1-amino-1,2,4-triazole, 1,2,3-triazole, 1-amino-1,2,3-triazole, 1-amino-5-methyl-1,2,3-triazole, 1,2,4-triazole-3-carboxamide, ribavirin, 2,4,6-triamino-1,3,5-triazine (melamine), 5-mercapto-1-phenyltetrazole, or any combination thereof.

The metal inhibitor in accordance with some embodiments is a pyrimidine selected from cytosine, isocytosine, folic acid, triamterene, 2-amino-4,6-dihydroxypyrimidine, 2,4-diamino-6-hydroxypyrimidine, 6-aminouracil, or any combination thereof.

In some embodiments, the metal inhibitor is a thiazole or thiazolinone selected from 2-methyl-4-isothiazolin-3-one (MIT), 2-aminothiazole, 2-amino-1,3,4-thiadiazole, 1,2-benzisothiazolin-3-one (BIT), 6-acetyl-2(3H)-benzothiazolone, or any combination thereof.

According to some embodiments, the metal inhibitor is a polyphenol selected from catechol, pyrogallol, resorcinol, hydroquinone, gallic acid, dopamine, adrenaline, or any combination thereof. In some embodiments, the metal inhibitor is barbituric acid or 1,3-dimethylbarbituric acid.

The metal inhibitor, according to some embodiments, is a Schiff base selected from compounds prepared by reaction of 1 or 2 equivalents of acetylacetone (ACAC), salicylic aldehyde (SAL), 4-methyl-5-imidazolecarboxaldehyde, pyrrole-2-carboxaldehyde, 2-thiophenecarboxaldehyde, or any combination thereof with 1 equivalent of hydroxylamine, En, ammonia, alkylamine in organic solvent, or any combination thereof.

In some embodiments, the metal inhibitor can comprise any combination of any of the aforesaid examples. In some embodiments, the metal inhibitor substantially excludes adenine (e.g., below about 0.001 wt. %, such as below about 0.0005 wt. %, below about 0.0001 wt. %, or zero adenine).

The metal inhibitor is guanine in some embodiments of the invention. In other embodiments, the metal inhibitor is hypoxanthine. In further embodiments, the metal inhibitor is 3-amino-1,2,4-triazole (3-ATA). The metal inhibitor is 3,5-diamino-1,2,4-triazole (3,5-ATA or guanazole) in some embodiments.

The metal inhibitor can be in any suitable amount. In some embodiments, the metal inhibitor is in an amount of from about 0.001 wt. % to about 10 wt. %, such as from about 0.001 wt. % to about 0.05 wt. %, from about 0.05 wt. % to about 0.1 wt. %, from about 0.1 wt. % to about 0.5 wt. %, or from about 0.5 wt. % to about 10 wt. %. For example, in some embodiments, the metal inhibitor is in an amount of from about 0.001 wt. % to about 0.05 wt. % when in a diluted form. In some embodiments, the metal inhibitor is in an amount of from about 0.05 wt. % to about 2.5 wt. % when in a concentrated form. In further embodiments when the metal inhibitor is in a concentrated form, the metal inhibitor is in an amount of from about 0.2 wt. % to about 10 wt. %.

In some embodiments, the metal inhibitor is present in a diluted form of amount of from about 0.01 wt. % to about 0.05 wt. %, e.g., from about 0.01 wt. % to about 0.04 wt. %, from about 0.01 wt. % to about 0.03 wt. %, from about 0.01 wt. % to about 0.02 wt. %, from about 0.02 wt. % to about 0.05 wt. %, from about 0.02 wt. % to about 0.04 wt. %, from about 0.02 wt. % to about 0.03 wt. %, from about 0.03 wt. % to about 0.05 wt. %, from about 0.03 wt. % to about 0.04 wt. %, or from about 0.04 wt. % to about 0.05 wt. %.

In some embodiments, the metal inhibitor is present in a concentrated form (e.g., a 50 times concentrate) of from about 0.5 wt. % to about 2.5 wt. %, e.g., from about 0.5 wt. % to about 2 wt. %, from about 0.5 wt. % to about 1.5 wt. %, from about 0.5 wt. % to about 1 wt. %, from about 1 wt. % to about 2.5 wt. %, from about 1 wt. % to about 2 wt. %, from about 1 wt. % to about 1.5 wt. %, from about 0.5 wt. % to about 1 wt. %, from about 1.5 wt. % to about 2.5 wt. %, from about 1.5 wt. % to about 2 wt. %, or from about 2 wt. % to about 2.5 wt. %.

In further embodiments, the metal inhibitor is present in a concentrated form (e.g., a 200 times concentrate) of from about 0.2 wt. % to about 10 wt. %, e.g., from about 0.2 wt. % to about 9 wt. %, from about 0.2 wt. % to about 8 wt. %, from about 0.2 wt. % to about 7 wt. %, from about 0.2 wt. % to about 6 wt. %, from about 0.2 wt. % to about 5 wt. %, from about 0.2 wt. % to about 4 wt. %, from about 0.2 wt. % to about 3 wt. %, from about 0.2 wt. % to about 2 wt. %, from about 0.2 wt. % to about 1.5 wt. %, from about 0.2 wt. % to about 1 wt. %, from about 0.2 wt. % to about 0.5 wt. %, from about 0.5 wt. % to about 10 wt. %, from about 0.5 wt. % to about 9 wt. %, from about 0.5 wt. % to about 8 wt. %, from about 0.5 wt. % to about 7 wt. %, from about 0.5 wt. % to about 6 wt. %, from about 0.5 wt. % to about 5 wt. %, from about 0.5 wt. % to about 4 wt. %, from about 0.5 wt. % to about 3 wt. %, from about 0.5 wt. % to about 2 wt. %, from about 0.5 wt. % to about 1.5 wt. %, from about 0.5 wt. % to about 1 wt. %, from about 1 wt. % to about 10 wt. %, from about 1 wt. % to about 9 wt. %, from about 1 wt. % to about 8 wt. %, from about 1 wt. % to about 7 wt. %, from about 1 wt. % to about 6 wt. %, from about 1 wt. % to about 5 wt. %, from about 1 wt. % to about 4 wt. %, from about 1 wt. % to about 3 wt. %, from about 1 wt. % to about 2 wt. %, from about 1 wt. % to about 1.5 wt. %, from about 1.5 wt. % to about 10 wt. %, from about 1.5 wt. % to about 9 wt. %, from about 1.5 wt. % to about 8 wt. %, from about 1.5 wt. % to about 7 wt. %, from about 1.5 wt. % to about 6 wt. %, from about 1.5 wt. % to about 5 wt. %, from about 1.5 wt. % to about 4 wt. %, from about 1.5 wt. % to about 3 wt. %, from about 1.5 wt. % to about 2 wt. %, from about 2 wt. % to about 10 wt. %, from about 2 wt. % to about 9 wt. %, from about 2 wt. % to about 8 wt. %, from about 2 wt. % to about 7 wt. %, from about 2 wt. % to about 6 wt. %, from about 2 wt. % to about 5 wt. %, from about 2 wt. % to about 4 wt. %, from about 2 wt. % to about 3 wt. %, from about 3 wt. % to about 10 wt. %, from about 3 wt. % to about 9 wt. %, from about 3 wt. % to about 8 wt. %, from about 3 wt. % to about 7 wt. %, from about 3 wt. % to about 6 wt. %, from about 3 wt. % to about 5 wt. %, from about 3 wt. % to about 4 wt. %, from about 4 wt. % to about 10 wt. %, from about 4 wt. % to about 9 wt. %, from about 4 wt. % to about 8 wt. %, from about 4 wt. % to about 7 wt. %, from about 4 wt. % to about 6 wt. %, from about 4 wt. % to about 5 wt. %, from about 5 wt. % to about 10 wt. %, from about 5 wt. % to about 9 wt. %, from about 5 wt. % to about 8 wt. %, from about 5 wt. % to about 7 wt. %, from about 5 wt. % to about 6 wt. %, from about 6 wt. % to about 10 wt. %, from about 6 wt. % to about 9 wt. %, from about 6 wt. % to about 8 wt. %, from about 6 wt. % to about 7 wt. %, from about 7 wt. % to about 10 wt. %, from about 7 wt. % to about 9 wt. %, from about 7 wt. % to about 8 wt. %, from about 8 wt. % to about 10 wt. %, from about 8 wt. % to about 9 wt. %, or from about 9 wt. % to about 10 wt. %.

Without wishing to be bound by any particular theory, it is believed that the metal inhibitor is present in an amount effective to protect the metal surface (e.g., copper surface) of a semiconductor wafer from the strong chelating ligand in the form of an organic amine, such as to prevent metal (e.g., copper) loss. It is believed that a strong chelating ligand as described above will cause corrosion of the metal (e.g., copper) surface, which can cause metal wire and/or liner to be completely dissolved. It is believed that the metal inhibitor significantly reduces corrosion. With a metal inhibitor, the dissolution of the metal surface of a semiconductor wafer caused by a strong chelating ligand will be minimal or nonexistent.

Dialkylhydroxylamine

In some embodiments, the composition optionally comprises one or more dialkylhydroxylamines or inorganic or organic acid salts thereof as an antioxidant. While not required, the dialkylhydroxylamine can be included in some embodiments to prolong the shelf-life of the inventive cleaning composition, particularly when THEMAH is used as a pH regulator. The inorganic or organic salts of the dialkylhydroxylamines are one or more of nitrate, phosphate, acetate, sulfate, hydrochloride, lactate, and glycolate. In some embodiments, the dialkylhydroxylamine is diethylhydroxylamine (DEHA).

The dialkylhydroxylamine can be present in any suitable amount in some embodiments. In some embodiments, the dialkylhydroxylamine is in an amount of from about 0.01 wt. % to about 12 wt. %, such as from about 0.01 wt. % to about 0.5 wt. %, from about 0.5 wt. % to about 3 wt. %, or from about 3 wt. % to about 12 wt. %. For example, in some embodiments, the dialkylhydroxylamine is in an amount of from about 0.001 wt. % to about 0.06 wt. % when in a diluted form. In some embodiments, the dialkylhydroxylamine is in an amount of from about 0.5 wt. % to about 3 wt. % when in a concentrated form. In further embodiments when the dialkylhydroxylamine is in a concentrated form, the dialkylhydroxylamine is in an amount of from about 2 wt. % to about 12 wt. %.

In some embodiments, the dialkylhydroxylamine is present in a diluted form of amount of from about 0.01 wt. % to about 0.06 wt. %, e.g., from about 0.01 wt. % to about 0.05 wt. %, from about 0.01 wt. % to about 0.04 wt. %, from about 0.01 wt. % to about 0.03 wt. %, from about 0.01 wt. % to about 0.02 wt. %, from about 0.02 wt. % to about 0.06 wt. %, from about 0.02 wt. % to about 0.05 wt. %, from about 0.02 wt. % to about 0.04 wt. %, from about 0.02 wt. % to about 0.03 wt. %, from about 0.03 wt. % to about 0.06 wt. %, from about 0.03 wt. % to about 0.05 wt. %, from about 0.03 wt. % to about 0.04 wt. %, from about 0.04 wt. % to about 0.06 wt. %, from about 0.04 wt. % to about 0.05 wt. %, or from about 0.05 wt. % to about 0.06 wt. %.

In some embodiments, the dialkylhydroxylamine is present in a concentrated form (e.g., in a 50 times concentrate) of from about 0.5 wt. % to about 3 wt. %, e.g., from about 0.5 wt. % to about 2.5 wt. %, from about 0.5 wt. % to about 2 wt. %, from about 0.5 wt. % to about 1.5 wt. %, from about 0.5 wt. % to about 1 wt. %, from about 0.5 wt. % to about 0.75 wt. %, from about 0.75 wt. % to about 3 wt. %, from about 0.75 wt. % to about 2.5 wt. %, from about 0.75 wt. % to about 2 wt. %, from about 0.75 wt. % to about 1.5 wt. %, from about 0.75 wt. % to about 2 wt. %, from about 1 wt. % to about 3 wt. %, from about 1 wt. % to about 2.5 wt. %, from about 1 wt. % to about 2 wt. %, from about 1 wt. % to about 1.5 wt. %, from about 1.5 wt. % to about 3 wt. %, from about 1.5 wt. % to about 2.5 wt. %, from about 1.5 wt. % to about 2 wt. %, from about 2 wt. % to about 3 wt. %, from about 2 wt. % to about 2.5 wt. %, or from about 2.5 wt. % to about 3 wt. %.

In further embodiments, the dialkylhydroxylamine is present in a concentrated form (e.g., in a 200 times concentrate) of from about 2 wt. % to about 12 wt. %, e.g., from about 2 wt. % to about 11 wt. %, from about 2 wt. % to about 10 wt. %, from about 2 wt. % to about 9 wt. %, from about 2 wt. % to about 8 wt. %, from about 2 wt. % to about 7 wt. %, from about 2 wt. % to about 6 wt. %, from about 2 wt. % to about 5 wt. %, from about 2 wt. % to about 4 wt. %, from about 2 wt. % to about 3 wt. %, from about 3 wt. % to about 12 wt. %, from about 3 wt. % to about 11 wt. %, from about 3 wt. % to about 10 wt. %, from about 3 wt. % to about 9 wt. %, from about 3 wt. % to about 8 wt. %, from about 3 wt. % to about 7 wt. %, from about 3 wt. % to about 6 wt. %, from about 3 wt. % to about 5 wt. %, from about 3 wt. % to about 4 wt. %, from about 4 wt. % to about 12 wt. %, from about 4 wt. % to about 11 wt. %, from about 4 wt. % to about 10 wt. %, from about 4 wt. % to about 9 wt. %, from about 4 wt. % to about 8 wt. %, from about 4 wt. % to about 7 wt. %, from about 4 wt. % to about 6 wt. %, from about 4 wt. % to about 5 wt. %, from about 5 wt. % to about 12 wt. %, from about 5 wt. % to about 11 wt. %, from about 5 wt. % to about 10 wt. %, from about 5 wt. % to about 9 wt. %, from about 5 wt. % to about 8 wt. %, from about 5 wt. % to about 7 wt. %, from about 5 wt. % to about 6 wt. %, from about 6 wt. % to about 12 wt. %, from about 6 wt. % to about 11 wt. %, from about 6 wt. % to about 10 wt. %, from about 6 wt. % to about 9 wt. %, from about 6 wt. % to about 8 wt. %, from about 6 wt. % to about 7 wt. %, from about 7 wt. % to about 12 wt. %, from about 7 wt. % to about 11 wt. %, from about 7 wt. % to about 10 wt. %, from about 7 wt. % to about 9 wt. %, from about 7 wt. % to about 8 wt. %, from about 8 wt. % to about 12 wt. %, from about 8 wt. % to about 11 wt. %, from about 8 wt. % to about 10 wt. %, from about 8 wt. % to about 9 wt. %, from about 9 wt. % to about 12 wt. %, from about 9 wt. % to about 11 wt. %, from about 9 wt. % to about 10 wt. %, from about 10 wt. % to about 12 wt. %, from about 10 wt. % to about 11 wt. %, or from about 11 wt. % to about 12 wt. %.

Without wishing to be bound by any particular theory, it is believed that the dialkylhydroxylamines or inorganic or organic acid salts thereof effectively stabilize the quaternary ammonium hydroxide base (e.g., THEMAH) optionally as desired, thereby significantly lengthening shelf-life. For example, in some embodiments, the composition is stable for at least about one month or more, such as at least about two months or more, at least about three months or more, at least about four months or more, at least about five months or more, at least about six months or more, at least about seven months or more, at least about eight months or more, at least about nine months or more, at least about ten months or more, at least about eleven months or more, at least about twelve months or more, at least about thirteen months or more, at least about fourteen months or more, at least about fifteen months or more, at least about sixteen months or more, at least about seventeen months or more, at least about eighteen months or more, at least about nineteen months or more, at least about twenty months or more, at least about twenty-one months or more, at least about twenty-two months or more, at least about twenty-three months or more, or at least about twenty-four months or more.

Water

The inventive cleaning composition contains water, which can be present in any suitable amount, such as to accommodate any desired dilution level. For example, depending on the desired degree of dilution or concentration, water can be present in cleaning compositions in accordance with embodiments of the invention, as used to clean a substrate, in an amount of from about 30 wt. % to about 99.9 wt. %, e.g., from about 30 wt. % to about 94 wt. %, from about 30 wt. % to about 89 wt. %, from about 30 wt. % to about 75 wt. %, from about 30 wt. % to about 50 wt. %, from about 30 wt. % to about 45 wt. %, from about 45 wt. % to about 99.9 wt. %, from about 45 wt. % to about 94 wt. %, from about 45 wt. % to about 89 wt. %, from about 45 wt. % to about 75 wt. %, from about 45 wt. % to about 50 wt. %, from about 50 wt. % to about 99.9 wt. %, from about 50 wt. % to about 94 wt. %, from about 50 wt. % to about 89 wt. %, from about 50 wt. % to about 75 wt. %, from about 75 wt. % to about 99.9 wt. %, from about 75 wt. % to about 94 wt. %, from about 75 wt. % to about 89 wt. %, from about 89 wt. % to about 99.9 wt. %, from about 89 wt. % to about 94 wt. %, or from about 94 wt. % to about 99.9 wt. %.

Illustrative Combinations of Components

It will be appreciated that the components of the invention can include a variety of ingredients as described in various combinations. For example, in some embodiments of the invention, the cleaning composition comprises, consists of, or consists essentially of: (a) one or more quaternary ammonium hydroxides present in an amount of from about 0.05 wt. % to about 40 wt. %; (b) one or more organic amines present in an amount of from about 0.002 wt. % to about 20 wt. %; (c) one or more metal inhibitors present in an amount of from about 0.001 wt. % to about 10 wt. %; and (d) water present in an amount of from about 30 wt. % to about 99.9 wt. %. The pH of the composition is from about 10 to about 14.

To illustrate, in various combinations, in some embodiments of the invention, the cleaning composition comprises, consists of, or consists essentially of: (a) trihydroxyethylmethylammonium hydroxide (THEMAH), (b) ethylenediamine (En) and/or 1,2-diaminopropane (Pn), and (c) guanine, hypoxanthine, 3-amino-1,2,4-triazole (3-ATA), 3,5-diamino-1,2,4-triazole (3,5-ATA or guanazole), or any combination thereof.

The following further illustrates various combinations of components of cleaning compositions in accordance with embodiments of the invention. In some embodiments, the quaternary ammonium hydroxide is trihydroxyethylmethylammonium hydroxide (THEMAH), the organic amine is ethylenediamine (En), and the metal inhibitor is guanine. In some embodiments, the quaternary ammonium hydroxide is trihydroxyethylmethylammonium hydroxide (THEMAH), the organic amine is 1,2-diaminopropane (Pn), and the metal inhibitor is guanine.

In some embodiments, the quaternary ammonium hydroxide is trihydroxyethylmethylammonium hydroxide (THEMAH), the organic amine is ethylenediamine (En), and the metal inhibitor is hypoxanthine.

In some embodiments, the quaternary ammonium hydroxide is trihydroxyethylmethylammonium hydroxide (THEMAH), the organic amine is 1,2-diaminopropane (Pn), and the metal inhibitor is hypoxanthine.

In some embodiments, the quaternary ammonium hydroxide is trihydroxyethylmethylammonium hydroxide (THEMAH), the organic amine is a combination of ethylenediamine (En) and 1,2-diaminopropane (Pn), and the metal inhibitor is guanine.

In some embodiments, the quaternary ammonium hydroxide is trihydroxyethylmethylammonium hydroxide (THEMAH), the organic amine is a combination of ethylenediamine (En) and 1,2-diaminopropane (Pn), and the metal inhibitor is hypoxanthine.

In some embodiments, the quaternary ammonium hydroxide is trihydroxyethylmethylammonium hydroxide (THEMAH), the organic amine is ethanolamine (MEA), and the metal inhibitor is 3-amino-1,2,4-triazole (3-ATA).

In some embodiments, the quaternary ammonium hydroxide is trihydroxyethylmethylammonium hydroxide (THEMAH), the organic amine is ethanolamine (MEA), and the metal inhibitor is 3,5-diamino-1,2,4-triazole (3,5-ATA or guanazole).

In some embodiments, the composition further comprises, consists of, or consists essentially of: diethylhydroxylamine (DEHA) in an amount of from about 0.01 wt. % to about 12 wt. %.

It shall be noted that the preceding are merely examples of such combinations. Other exemplary combinations are apparent from the entirety of the description herein. It will also be understood by one of ordinary skill in the art that each of these embodiments may be used in various combinations with the other embodiments provided herein.

Mechanism

Figure 3:
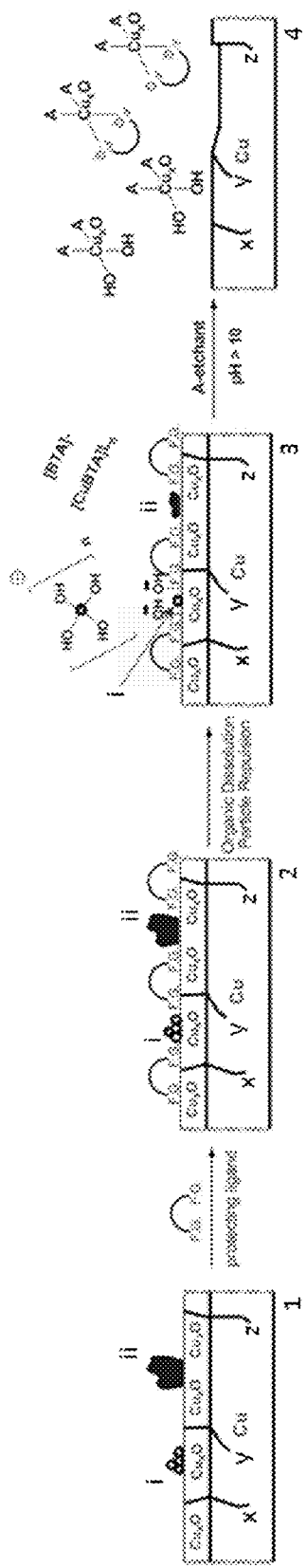
FIG. 3, while not wishing to be bound by any particular theory, is a schematic depiction believed to illustrate a mechanism in accordance with embodiments of the invention.

Reference is now made to FIG. 3. While not wishing to be bound by any particular theory, representations 1-4 are believed to illustrate a mechanism in accordance with embodiments of the invention.

The starting point depicted by representation 1 illustrates copper as a base metal on a semiconductor wafer. Grain boundaries (x), (y), and (z) of the metal are shown schematically in FIG. 3. Abrasive particles (i) and copper-BTA adducts (ii) on the copper metal surface of the semiconductor wafer represent typical contaminants that remain on the surface after CMP has taken place.

It is believed that a cleaning composition prepared in accordance with embodiments of the invention can be applied to clean a semiconductor wafer by a method in accordance with embodiments of the invention, as described below, such that the metal (e.g., copper) inhibitor (depicted as "F.G.") passivates the copper oxide layer, such that copper oxide ($Cu_xO$) and the copper (0) (Cu) beneath it are effectively protected from dissolution during cleaning following CMP. Representation 2 is believed to illustrate the metal (e.g., copper) inhibitor passivating the copper oxide layer, leaving only contaminants unprotected on the surface.

Representation 3 is believed to illustrate the strong chelating ligand in the form of an organic amine (depicted by "L") dissolving organic residue such as BTA from the copper-BTA adducts, reducing them in size. The strong chelating ligand displaces BTA from the copper-BTA adducts. BTA is then dissolved along with copper inside the copper-BTA adducts in a more soluble form. It is further believed that particles (e.g., remnants from CMP) are removed via repulsion because the quaternary ammonium hydroxide negatively charges the surface of the semiconductor wafer and the particles thereon.

Representation 4 is believed to illustrate dynamic equilibrium. In order for this to occur, the metal (e.g., copper) inhibitor must have a high affinity for the metal (e.g., copper) of which the surface is formed. Representation 4 shows how the metal (e.g., copper) surface might appear after cleaning with a composition prepared in accordance with embodiments of the invention has taken place, when the pH is greater than about 10 (e.g., about 10-14).

Corrosion defects do not occur until all of the copper oxide has been removed by the strong chelating ligand in the form of an organic amine. While some copper oxide loss is likely to occur during cleaning, it is believed that the dissolution of copper oxide will happen very slowly in the presence of the metal inhibitor. After cleaning has taken place, any contaminants on top of the copper surface will have been mostly dissolved due to the strong chelating ligand in the form of an organic amine and the high OH concentration. In general, the mechanism resulting in representation 4 is believed to generate lower surface roughness.

Figure 4:
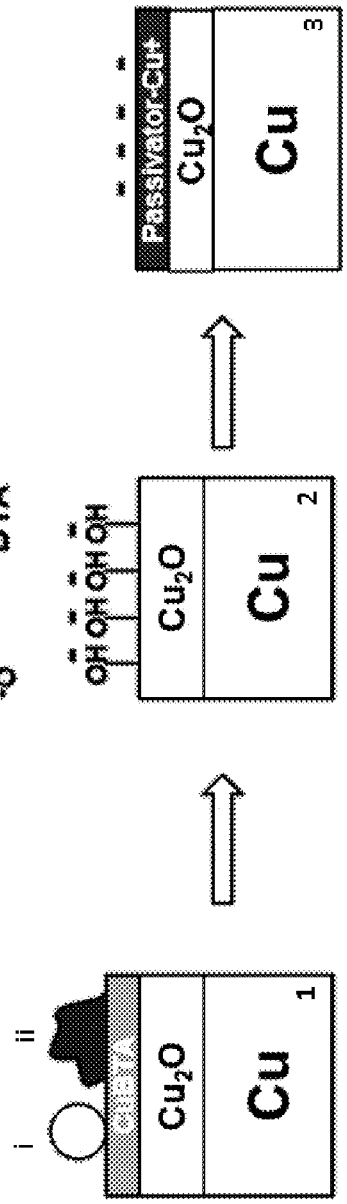
FIG. 4, while not wishing to be bound by any particular theory, is a schematic depiction believed to illustrate a mechanism in accordance with embodiments of the invention.

Referring now to FIG. 4, while not wishing to be bound by any particular theory, representations 1-3 are believed to further illustrate a mechanism in accordance with embodiments of the invention. The starting point depicted by representation 1 illustrates copper as a base metal on a semiconductor wafer with an aggregate of abrasive particles (i) and copper-BTA adducts (ii) representing typical contaminants that remain on the surface after CMP has taken place.

Representation 2 shows possible reactions resulting from the application of a cleaning composition prepared in accordance with embodiments of the invention. The quaternary ammonium hydroxide base negatively charges the particle aggregate and the copper surface. Thus, the particle aggregate and surface repel each other, while BTA ligands are displaced by a strong chelating ligand (depicted by "L") in the form of an organic amine and then dissolved in deprotonated form at a high pH. The $[Cu(L)_x]^+$ formation is believed to represent a mixed ligand complex, including BTA and the strong chelating ligand.

In order to avoid copper corrosion by the strong chelating ligand, the copper oxide layer ($Cu_2O$) is passivated by a metal (e.g., copper) inhibitor (Passivator-Cu+), which is believed to be illustrated in representation 3. As representation 3 shows, while some copper oxide was dissolved during cleaning, the copper inhibitor was able to protect most of it. Additionally, copper beneath the copper oxide layer remains intact. Metal inhibitors described herein allow for the use of very aggressive strong chelating ligands, also described herein, in high concentrations for effective post-CMP cleaning that dissolves contaminants and generates low roughness.

Method of Cleaning

The invention also provides a cleaning method. The cleaning method comprises, consists of, or consists essentially of (a) providing a semiconductor wafer having contaminants resulting from chemical-mechanical polishing of the semiconductor wafer and (b) contacting the surface of the semiconductor wafer with a cleaning composition in accordance with embodiments of the invention to remove at least some of the contaminants from the surface of the semiconductor wafer. As noted herein, the contaminants can include, for example, abrasive particles, organic residue, metal ions, pad debris and CMP-byproducts, or any combination thereof. The wafer can include metal conductors and/or a low-k dielectric material in various embodiments.

The method includes applying a cleaning composition in accordance with embodiments of the invention to selectively remove contaminants, while the metal conductors and/or low-k dielectric material remain substantially intact. In some embodiments, are formed from at least copper, tungsten, cobalt, and/or ruthenium.

The invention further provides a method for polishing and cleaning the surface of a semiconductor wafer. The method comprises, consists of, or consists essentially of: (a) providing a polishing pad, a chemical-mechanical polishing composition, and a semiconductor wafer; (b) contacting the semiconductor wafer with the polishing pad and the polishing composition; (c) moving the polishing pad relative to a surface of the semiconductor wafer with the polishing composition therebetween to abrade the surface of the semiconductor wafer and thereby polish the surface of the wafer such that the polished surface of the wafer contains contaminants from the chemical-mechanical polishing composition; and (d) contacting the polished surface of the semiconductor wafer that contains contaminants with a cleaning composition as described herein to remove at least some of the contaminants from the polished surface of the semiconductor wafer.

Typically a chemical-mechanical polishing composition will be utilized in the polishing of a semiconductor wafer with a polishing pad, such that the inventive method of polishing and cleaning a semiconductor wafer further comprises providing a chemical-mechanical polishing composition between the polishing pad and the semiconductor wafer, contacting the semiconductor wafer with the polishing pad with the polishing composition therebetween, and moving the polishing pad relative to the semiconductor wafer with the polishing composition therebetween to abrade the semiconductor wafer and thereby polish the semiconductor wafer. The invention is not limited by the polishing composition, which can be any suitable polishing composition as known in the art. Additionally, the invention is not limited by the CMP apparatus and polishing pad used during polishing, which can be any suitable CMP apparatus and polishing pad, many of which are known in the art.

Generally, chemical-mechanical polishing apparatus comprises (a) a platen that rotates; (b) a polishing pad disposed on the platen; and (c) a carrier that holds a semiconductor wafer to be polished by contacting the rotating polishing pad. In some embodiments, the apparatus further comprises (d) means for delivering a chemical-mechanical polishing composition between the polishing pad and the semiconductor wafer. For example, in some embodiments, the means for delivering the chemical-mechanical polishing composition can include, for example, a pump and flow metering system.

The following Examples further illustrate the invention but, of course, should not be construed as in any way limiting its scope. All cleaning compositions in the following Examples were prepared with deionized water and in a 50 times concentrate.

Example 1 (Comparative)

This comparative Example illustrates the use of cleaning compositions prepared with very high etching power after chemical-mechanical polishing ("CMP") has taken place on a wafer substrate containing copper.

In particular, blanket wafers (i.e., without any patterns) containing copper were subjected to platen-2 ("P2") copper polishing as understood in the art using a copper polishing composition containing about 25 ppm by weight benzotriazole (BTA), and a polishing pad commercially identified as D100™ available from CMC. Each blanket copper wafer was then subjected to platen-3 ("P3") barrier polishing as understood in the art using a polishing composition comprising 400 ppm BTA, and a polishing pad commercially identified as Fujibo H7000 available from Fujibo (Tokyo, Japan). Polishing was performed on a Mirra™ CMP apparatus (Applied Materials, Inc., Santa Clara, Calif.) with standard polishing parameters.

Five cleaning compositions, designated Compositions 1A-1D, were tested with regards to cleaning ability, measured by the number of cleaning related defects on the wafer, and roughness, measured in Angstroms. Composition 1B is commercially available as Clean8158T™ from CMC. Table 1 below details the components and amounts of Compositions 1A-1D. The components of Compositions 1A-1D in various combinations are: monoethanolamine (MEA), N-(2-Aminoethyl)ethanolamine (AEAE), carbohydrazide (CHZ), Ascorbic acid (Asc), Dequest 2000 (D2000), triethanolamine (TEA), and/or aminopropylmorpholine (APM).

TABLE 1

| | | | | | | | | |
|---|---|---|---|---|---|---|---|---|
| | (50 times concentrate) | | | | | | | |
| Composition | Base | MEA | TEA | APM | ASC | AEAE | Dequest 2000 | CHZ |
| 1A | 5 wt. % TMAH | 9 wt. % | | | 3.5 wt. % | | | |
| 1B | 4 wt. % TMAH | 9 wt. % | | | | | 1.25 wt. % | 1.5 wt. % |
| 1C | 5 wt. % THEMAH | | 20 wt. % | 12 wt. % | | 2 wt. % | | |

TABLE 1-continued

| | (50 times concentrate) | | | | | | | |
|---|---|---|---|---|---|---|---|---|
| Composition | Base | MEA | TEA | APM | ASC | AEAE | Dequest 2000 | CHZ |
| 1D | 5 wt. % THEMAH | | 20 wt. % | 12 wt. % | | 0.5 wt. % | | |

The polished wafer substrates were cleaned with one of Compositions 1A-1E for 30 second trials. Cleaning was performed with an ONTRAK™ DSS200 Integra tool. Following each trial, cleaning related defects found on each wafer were counted and categorized as will be appreciated by one of ordinary skill in the art.

In addition, post-CMP roughness was measured with an atomic force microscope. Roughness is the average difference between the highest and lowest points on the wafer surface.

The Compositions were evaluated based on cleaning ability, measured by the total number defects, and roughness, measured in Angstroms. The results are recorded in Table 2 below and illustrated in FIG. 5, which is a graph that compares cleaning ability, represented by the scale on the left y-axis labeled "Number of Defects," with roughness, represented by the scale on the right y-axis labeled "Roughness (Å)."

Figure 5:
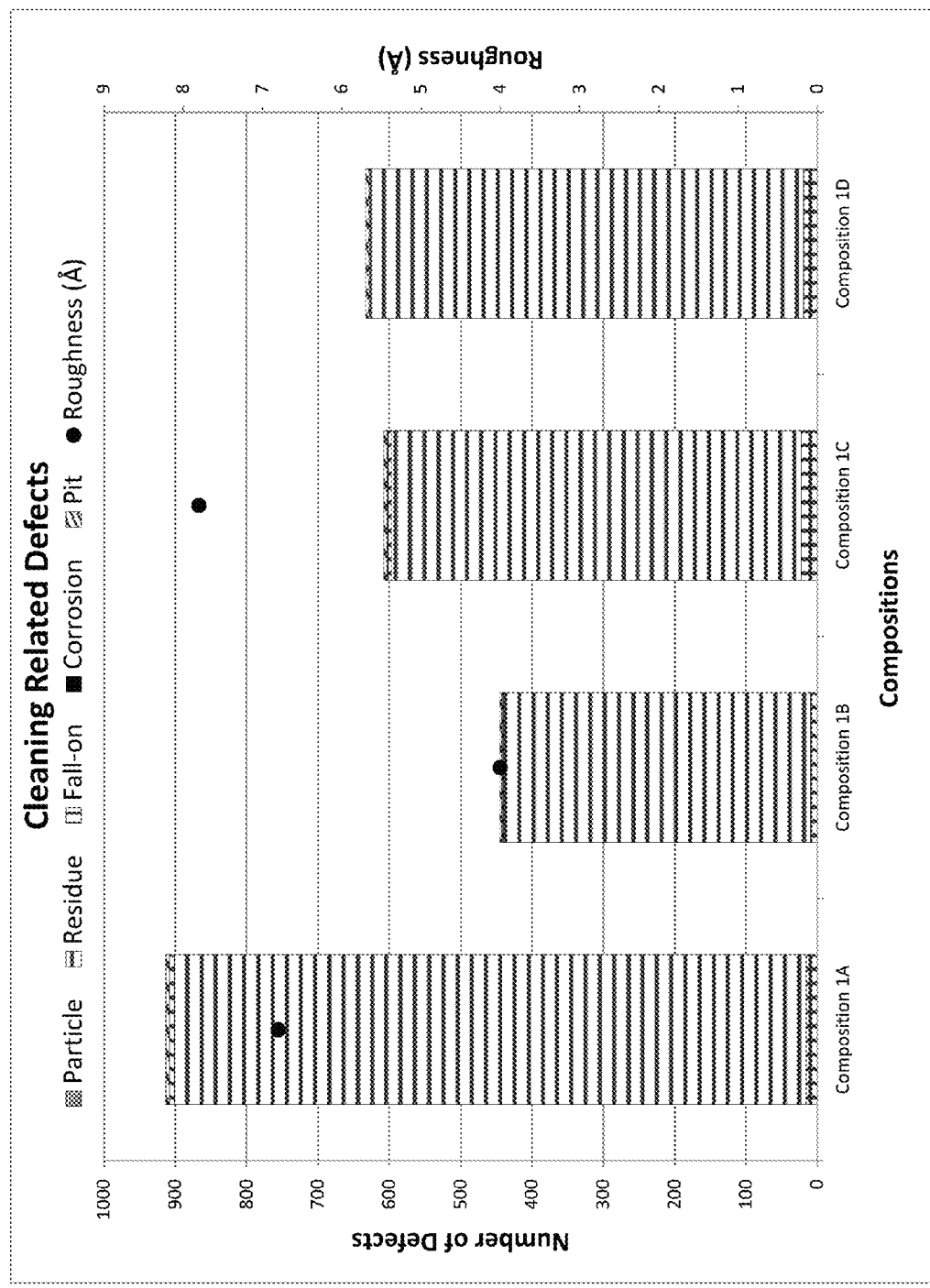
FIG. 5 is a graph evaluating cleaning compositions after being applied to blanket wafers containing copper, based on a comparison of (a) cleaning ability, wherein the numbers of cleaning related defects of various types (particle, residue, fall-on, corrosion, and pit) are represented by the scale on the left side labeled "Number of Defects," with (b) roughness in Angstroms, represented by the scale on the right side labeled "Roughness (A)" as set forth in Example 1.

The various defects in FIG. 5 and Table 2 were categorized by visual observation, with the number of each indicated. As described herein, the defects were categorized into the following types: particle (remnants from previous polishing); particle aggregate (groups of particles, i.e., two or more particles that are touching); small organic residue (residue that is less than one micron in size); large organic residue (residue that is greater than one micron); fall-on particle (a large particle of any shape that may have precipitated on the wafer surface); corrosion (a large area of higher local roughness); and pit defect (small, deep holes on the wafer surface that are considered more pronounced corrosion defects). Roughness is set forth as the arithmetic mean value (Ra). Composition 1D was not evaluated for roughness.

TABLE 2

| | Cleaning Related Defects | | | | |
|---|---|---|---|---|---|
| Composition | Particles | Residues | Fall-on | Pitts/ Corrosion | Roughness (Å) |
| 1A | 16 | 885 | 7 | 6 | 6.8 |
| 1B | 9 | 430 | 1 | 3 | 4.0 |
| 1C | 23 | 574 | 5 | 6 | 7.8 |
| 1D | 19 | 608 | 2 | 4 | N/A |

As seen in Table 2 and FIG. 5, Compositions 1A-1D were not fully satisfactory. For example, although Composition 1A generated no corrosion defects, it possessed low cleaning ability and generated substantial pit defects and high roughness. Composition 1B possessed good cleaning ability, but generated high roughness. Composition 1C, prepared with a four times greater concentration of aminoethylethanolamine ("AEAE"), an aggressive etchant, than Composition 1D, has a comparable cleaning ability as Composition 1D, suggesting a higher etchant concentration does not lead to better cleaning ability. Thus, these results demonstrate a need in the art for post-CMP cleaning compositions that possess good cleaning ability and generate low post-CMP roughness.

Example 2

This Example compares the effectiveness of a cleaning composition compared in accordance with embodiments of the invention with different cleaning compositions after chemical-mechanical polishing ("CMP") has taken place on a wafer substrate containing copper.

In particular, blanket wafers (i.e., without any patterns) containing copper were subjected to P2 copper polishing and P3 barrier polishing as described in Example 1.

As recited below in Table 3, three cleaning compositions, designated 2A-2C, were prepared with either tetraethylammonium hydroxide (TMAH) or tris(2-hydroxyethyl)methylammonium hydroxide (THEMAH) as a base, either monoethanolamine (MEA) or Ethylenediamine (En) as an organic amine, and diethylhydroxylamine (DEHA) as an antioxidant. Composition 2A, commercially available as Clean8158T™, was prepared, for purposes of comparison, with an etchant containing triphosphonic acid commercially available as Dequest 2000™ (D2000) from Dequest Italmatch Chemicals and carbohydrazide (CHZ) as an organic inhibitor, while Compositions 2B and 2C were prepared in accordance with embodiments of the invention.

TABLE 3

| | (50 times concentrate) | | | | | | |
|---|---|---|---|---|---|---|---|
| Composition | Base | MEA | EN | D2000 | Guanine | CHZ | DEHA |
| 2A | 4 wt. % TMAH | 9 wt. % | | 1.25 wt. % | | 1.5 wt. % | 0.5 wt. % |
| 2B | 5 wt. % THEMAH | | 0.5 wt. % | | 0.5 wt. % | | 0.5 wt. % |
| 2C | 10 wt. % THEMAH | | 0.5 wt. % | | 0.5 wt. % | | 0.5 wt. % |

The polished wafer substrates were cleaned with one of Compositions 2A-2C for 30 second trials. Cleaning was performed with an ONTRAK™ DSS200 Integra tool. Following each trial, cleaning related defects found on each wafer were counted and categorized as will be appreciated by one of ordinary skill in the art.

In addition, post-CMP roughness was measured with an atomic force microscope. Roughness is the average difference between the highest and lowest points on the wafer surface.

The Compositions were evaluated based on cleaning ability, measured by the total number defects, and roughness, measured in Angstroms. The results are recorded in Table 4 below and illustrated in FIG. 6, which is a graph that demonstrates cleaning ability, represented by the scale on the y-axis labeled "Number of Defects." The various categories of cleaning related defects documented in Table 4 below have been defined above. Roughness is set forth as the arithmetic mean value (Ra).

TABLE 4

| Formulation | Cleaning Related Defects | | | Roughness (Å) |
|---|---|---|---|---|
| | Particles | Residue | Pits/Corrosion | |
| 2A | 8 | 548 | 38 | 3.41 |
| 2B | 15 | 106 | 5 | 2.83 |
| 2C | 7 | 95 | 1 | 2.32 |

Figure 6:
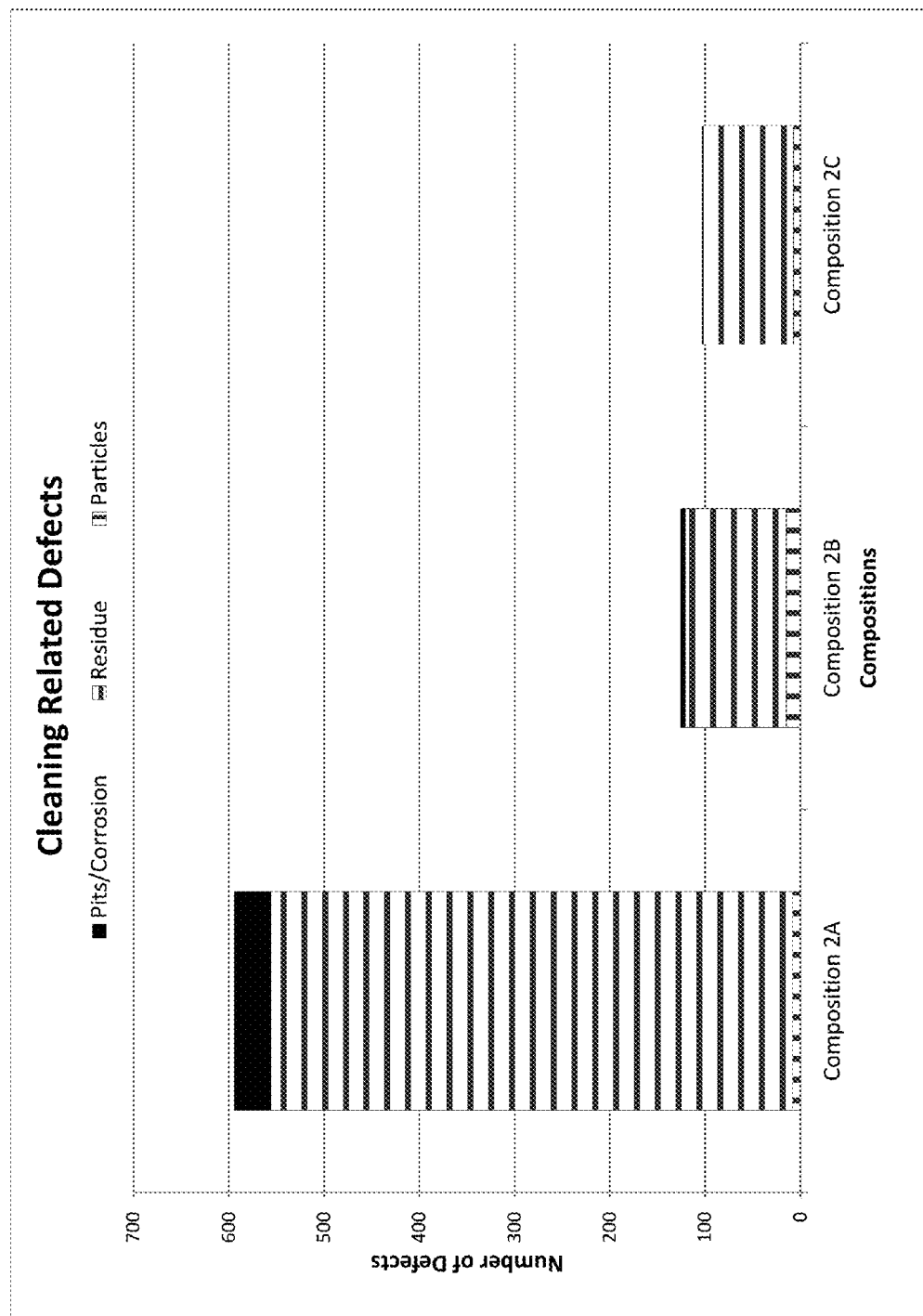
FIG. 6 is a graph evaluating cleaning compositions after being applied to blanket wafers containing copper based on cleaning ability, wherein the numbers of cleaning related defects of various types (particle, residue, and pits/corrosion) are represented by the scale on the left side labeled "Number of Defects" as set forth in Example 2.

As Table 4 and FIG. 6 illustrate, Composition 2A, in both tests, resulted in considerably more organic residue. Compositions 2B and 2C, prepared with the typically corrosive organic amine En and guanine as a metal inhibitor, demonstrated significantly better cleaning ability and resulted in considerably lower post-CMP roughness than Composition 2A, which was prepared without a metal inhibitor. Composition 2C, which was prepared with the aggressive organic amine, En, guanine as a metal inhibitor, and THEMAH as a base in a concentration twice that of Composition 2B, demonstrated a lower particle defect number, lower corrosion, and lower post-CMP roughness than Compositions 2A and 2B. These results, therefore, demonstrate that cleaning compositions in accordance with embodiments of the invention possess good cleaning ability and generate low post-CMP roughness.

Example 3

This Example compares the effectiveness of a cleaning composition compared in accordance with embodiments of the invention with different cleaning compositions after chemical-mechanical polishing ("CMP") has taken place on a wafer substrate containing copper.

In particular, blanket wafers (i.e., without any patterns) containing copper were subjected to P2 copper polishing and P3 barrier polishing as described in Example 1.

As recited below in Table 5, two cleaning compositions, designated 3A-3B, were prepared with either tetraethylammonium hydroxide (TMAH) or tris(2-hydroxyethyl)methylammonium hydroxide (THEMAH) as a base, either monoethanolamine (MEA) or 1,2-diaminopropane (Pn) as an organic amine, and diethylhydroxylamine (DEHA) as an antioxidant. Composition 3A, commercially available as Clean8158T™, was prepared, for purposes of comparison, with an etchant containing triphosphonic acid commercially available as Dequest 2000™ (D2000) from Dequest Italmatch Chemicals and carbohydrazide (CHZ) as an organic inhibitor, while Composition 3B was prepared in accordance with embodiments of the invention.

TABLE 5

| | (50 times concentrate) | | | | | |
|---|---|---|---|---|---|---|
| Composition | Base | MEA | Pn | D2000 | Guanine | CHZ | DEHA |
| 3A | 4 wt. % TMAH | 9 wt. % | | 1.25 wt. % | | 1.5 wt. % | 0.5 wt. % |
| 3B | 10 wt. % THEMAH | | 1.2 wt. % | | 0.2 wt. % | | 0.5 wt. % |

The polished wafer substrates were cleaned with one of Compositions 3A-3B for 30 second trials. Cleaning was performed with an ONTRAK™ DSS200 Integra tool. Following each trial, cleaning related defects found on each wafer were counted and categorized as will be appreciated by one of ordinary skill in the art.

In addition, post-CMP roughness was measured with an atomic force microscope. Roughness is the average difference between the highest and lowest points on the wafer surface.

The Compositions were evaluated based on cleaning ability, measured by the total number defects, and roughness, measured in Angstroms. The results are recorded in Table 6 below and illustrated in FIG. 7, which is a graph that demonstrates cleaning ability, represented by the scale on the y-axis labeled "Number of Defects." The various categories of cleaning related defects documented in Table 6 below have been defined above. Roughness is set forth as the arithmetic mean value (Ra).

TABLE 6

| Formulation | Cleaning Related Defects | | | Roughness (Å) |
|---|---|---|---|---|
| | Particles | Residue | Pits/Corrosion | |
| 3A | 41 | 527 | 33 | 3.82 |
| 3B | 28 | 121 | 38 | 3.42 |

Figure 7:
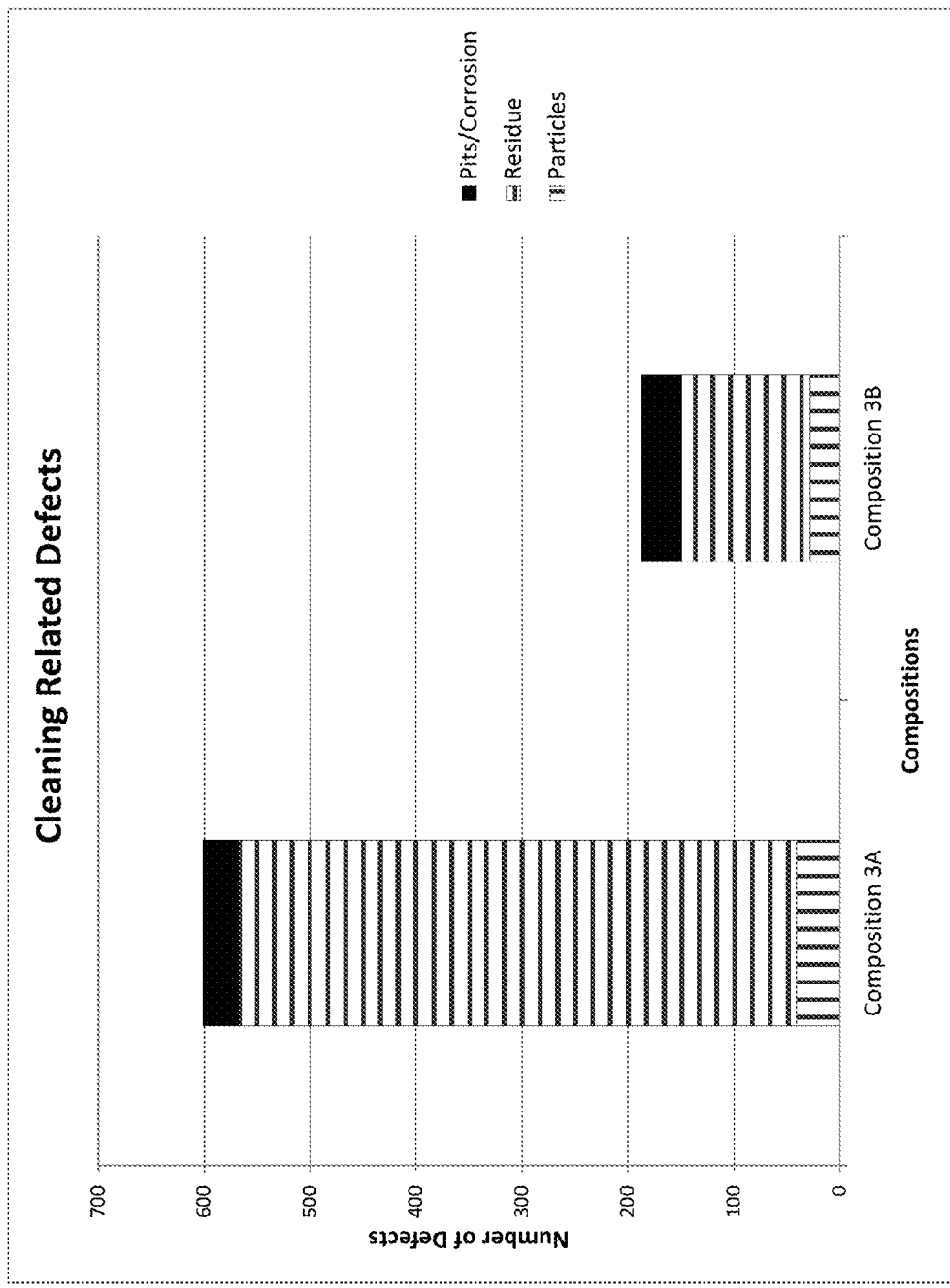
FIG. 7, is a graph evaluating cleaning compositions after being applied to blanket wafers containing copper based on cleaning ability, wherein the numbers of cleaning related defects of various types (particle, residue, and pits/corrosion) are represented by the scale on the left side labeled "Number of Defects" as set forth in Example 3.

As Table 6 and FIG. 7 illustrate, Composition 3A resulted in more organic residue than Composition 3B. Composition 3B, prepared with the typically corrosive organic amine Pn and a low concentration of guanine as a metal inhibitor, demonstrated significantly better cleaning ability and resulted in considerably lower post-CMP roughness than Composition 3A, which was prepared without a metal inhibitor. These results, therefore, demonstrate that cleaning compositions in accordance with embodiments of the invention possess good cleaning ability and generate low post-CMP roughness.

Example 4

This Example compares the effectiveness of a cleaning composition compared in accordance with embodiments of the invention with different cleaning compositions after chemical-mechanical polishing ("CMP") has taken place on a wafer substrate containing copper.

In particular, blanket wafers (i.e., without any patterns) containing copper were subjected to P2 copper polishing and P3 barrier polishing as described in Example 1.

As recited below in Table 7, three cleaning compositions, designated 4A-4B, were prepared with either tetraethylammonium hydroxide (TMAH) or tris(2-hydroxyethyl)methylammonium hydroxide (THEMAH) as a base, either monoethanolamine (MEA) or 1,2-diaminopropane (Pn) as an organic amine, and diethylhydroxylamine (DEHA) as an antioxidant. Composition 4A, commercially available as Clean8158T from CMC, was prepared, for purposes of comparison, with an etchant containing triphosphonic acid commercially available as Dequest 2000™ (D2000) from Dequest Italmatch Chemicals and carbohydrazide (CHZ) as an organic inhibitor, while Composition 4B was prepared in accordance with embodiments of the invention with hypoxanthine (designated "H" in the table) as a metal inhibitor.

TABLE 7

(50 times concentrate)

| Composition | Base | MEA | Pn | D2000 | H | CHZ | DEHA |
|---|---|---|---|---|---|---|---|
| 4A | 4 wt. % TMAH | 9 wt. % | | 1.25 wt. % | | 1.5 wt. % | 0.5 wt. % |
| 4B | 10 wt. % THEMAH | | 1.2 wt. % | | 0.5 wt. % | | 0.5 wt. % |

The polished wafer substrates were cleaned with one of Compositions 4A-4B for 30 second trials. Cleaning was performed with an ONTRAK™ DSS200 Integra tool. Following each trial, cleaning related defects found on each wafer were counted and categorized as will be appreciated by one of ordinary skill in the art.

In addition, post-CMP roughness was measured with an atomic force microscope. Roughness is the average difference between the highest and lowest points on the wafer surface.

The Compositions were evaluated based on cleaning ability, measured by the total number defects, and roughness, measured in Angstroms. The results are recorded in Table 8 below and illustrated in FIG. 8, which is a graph that demonstrates cleaning ability, represented by the scale on the y-axis labeled "Number of Defects." The various categories of cleaning related defects documented in Table 8 below have been defined above. Roughness is set forth as the arithmetic mean value (Ra).

TABLE 8

| Formulation | Cleaning Related Defects | | | Roughness (Å) |
|---|---|---|---|---|
| | Particles | Residue | Pits/Corrosion | |
| 4A | 41 | 527 | 33 | 3.82 |
| 4B | 18 | 89 | 1 | 3.02 |

Figure 8:
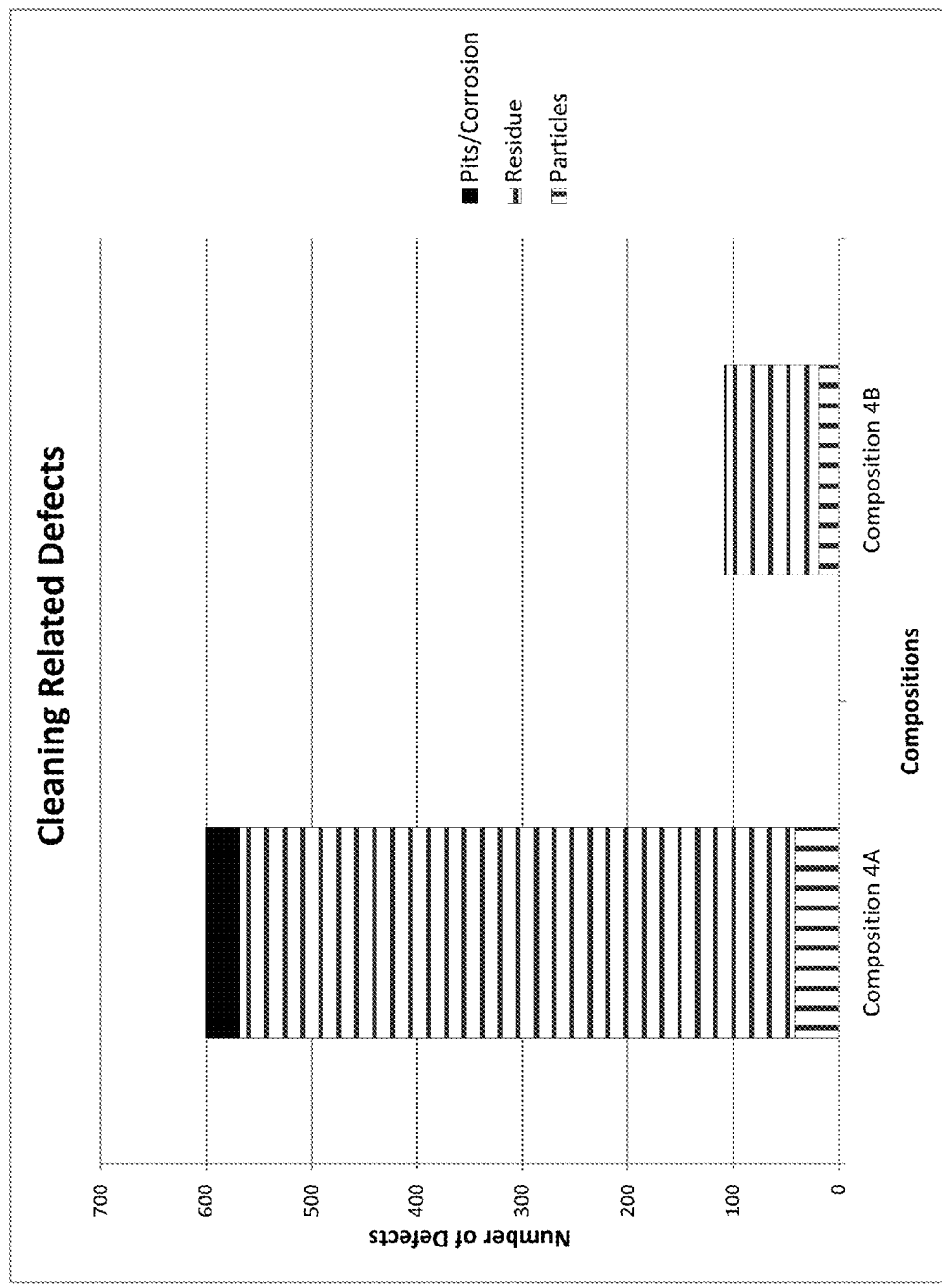
FIG. 8 is a graph evaluating cleaning compositions after being applied to blanket wafers containing copper based on cleaning ability, wherein the numbers of cleaning related defects of various types (particle, residue, and pits/corrosion) are represented by the scale on the left side labeled "Number of Defects" as set forth in Example 4.

As Table 8 and FIG. 8 illustrate, Composition 4A resulted in more organic residue than Composition 4B. Composition 4B, prepared with the typically corrosive organic amine Pn and low concentration of hypoxanthine as a metal inhibitor, demonstrated significantly better cleaning ability and resulted in considerably lower post-CMP roughness than Composition 4A, which was prepared without a metal inhibitor. Composition 4B also demonstrated a very low number of pits/corrosion defects. These results, therefore, demonstrate that cleaning compositions in accordance with embodiments of the invention possess good cleaning ability and generate low post-CMP roughness.

Example 5

This Example compares the effectiveness of a cleaning composition compared in accordance with embodiments of the invention with different cleaning compositions after chemical-mechanical polishing ("CMP") has taken place on a wafer substrate containing copper.

In particular, blanket wafers (i.e., without any patterns) containing copper were subjected to P2 copper polishing as described in Example 1. Each blanket copper wafer was then subjected to P3 barrier polishing as understood in the art using a polishing composition containing 400 ppm BTA, and a polishing pad commercially identified as Fujibo H7000 was used. Polishing was performed on a Mirra™ CMP apparatus with standard polishing parameters.

As recited below in Table 9, two cleaning compositions, designated 5A-5B, were prepared with either tetraethylammonium hydroxide (TMAH) or tris(2-hydroxyethyl)methylammonium hydroxide (THEMAH) as a base and monoethanolamine (MEA) as an organic amine. Composition 5A also included carbohydrazide (CHZ) as an antioxidant organic inhibitor. Composition 5B was prepared with diethylhydroxylamine (DEHA) as an antioxidant. Composition 5A was prepared with an etchant containing triphosphonic acid commercially available as Dequest 2000™ (D2000) from Dequest Italmatch Chemicals. Composition 5A, commercially available as Clean8158T™, was prepared for purposes of comparison without a metal inhibitor, while Composition 5B was prepared in accordance with embodiments of the invention with a metal inhibitor.

TABLE 9

(50 times concentrate)

| Composition | Base | MEA | D2000 | Metal Inhibitor | CHZ | DEHA |
|---|---|---|---|---|---|---|
| 5A | 4 wt. % TMAH | 9 wt. % | 1.25 wt. % | | 1.5 wt. % | |
| 5B | 5 wt. % THEMAH | 6 wt. % | | 1.5 wt. % 3-ATA | | 0.5 wt. % |

The polished wafer substrates were cleaned with one of Compositions 5A-5B for 60 second trials. Cleaning was performed with an ONTRAK™ DSS200 Integra tool. Following each trial, cleaning related defects found on each wafer were counted as will be appreciated by one of ordinary skill in the art. In addition, post-CMP roughness was measured. The Compositions were evaluated based on cleaning ability, measured by the total number defects, and roughness, measured in Angstroms.

Figure 9:
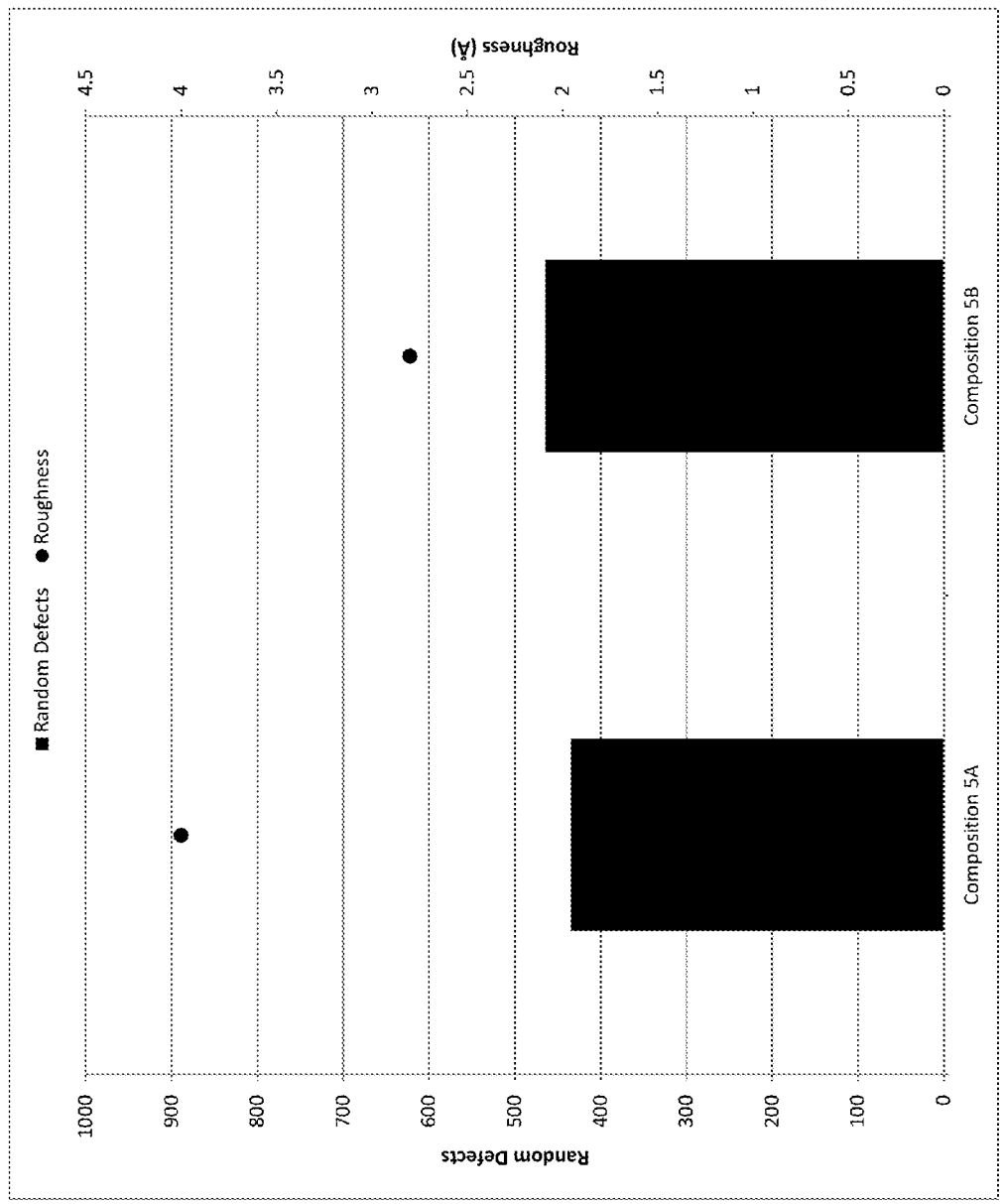
FIG. 9, is a graph evaluating cleaning compositions after being applied to blanket wafers containing copper, based on a comparison of (a) cleaning ability, wherein the number of cleaning related defects is represented by the scale on the left side labeled "Number of Defects," with (b) roughness in Angstroms, represented by the scale on the right side labeled "Roughness (Å)" as set forth in Example 5.

The results are shown in Table 10 below and FIG. 9, which is a graph that compares cleaning ability, represented by the scale on the left y-axis labeled "Number of Defects," with roughness, represented by the scale on the right y-axis. Roughness is set forth as the arithmetic mean value (Ra).

TABLE 10

| Composition | Random Defects | Roughness (Å) |
|---|---|---|
| 5A | 434 | 4 |
| 5B | 464 | 2.8 |

As Table 10 and FIG. 7 illustrate, Composition 5B, in accordance with embodiments of the invention, demonstrated good cleaning ability comparable to that of Composition 5A as well as significantly lower post-CMP roughness than Composition 5A. Thus, cleaning compositions in accordance with embodiments of the invention provide good cleaning and low post-CMP roughness when used to clean copper wafers after CMP has occurred.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A composition comprising:
   (a) one or more quaternary ammonium hydroxides in an amount effective to regulate the pH of the composition to a pH of from about 10 to about 14,
   (b) one or more organic amines,
   (c) one or more metal inhibitors selected from purines, azoles, pyrimidines, thiazoles, thiazolinones, and combinations thereof, and
   (d) water,
   wherein the composition further comprises one or more dialkylhydroxylamines or inorganic or organic acid salts thereof,
   wherein the composition is suited for removing contaminants from semiconductor wafers following chemical-mechanical polishing.

2. The composition of claim 1, wherein the quaternary ammonium hydroxide is ethyltrimethylammonium hydroxide (ETMAH), diethyldimethylammonium hydroxide (DEDMAH), tetraethylammonium hydroxide (TEAM), tetrapropylammonium hydroxide (TPAH), tetrabutylammonium hydroxide (TBAH), tributylmethylammonium hydroxide, tripropylmethylammonium hydroxide, benzyltrimethylammonium hydroxide (BTMAH), trihydroxyethylmethylammonium hydroxide (THEMAH), or any combination thereof.

3. The composition of claim 2, wherein the quaternary ammonium hydroxide is trihydroxyethylmethylammonium hydroxide (THEMAH).

4. The composition of claim 1, wherein the quaternary ammonium hydroxide is present in an amount of about 0.05% to about 40% by weight based on the total weight of the composition.

5. The composition of claim 1, wherein the one or more organic amine is diethanolamine (DEA), triethanolamine (TEA), methyl diethanolamine (MDEA), aminoethylethanolamine (aminoethylaminoethanol, AEAE), 2-amino-2-methyl-1-propanol, 3-amino-1-propanol, 2-dimethylamino-2-methylpropanol, 2methylamino ethanol, 1-amino-2-propanol, 2(2-dimethylamino)ethyl)methylamino)ethanol, N,N'-bis(2-hydroxyethyl)ethylenediamine), 2(tert-butylamino)ethanol, 2-dimethylaminoethanol, 2-aminophenol, 1-amino-2-propanol, cysteamine, glycine, diethylenetriamine, pentaethylenehexamine, N,N'-di-tert-butylethylenediamine, N,N'-diethylethylenediamine, ethylenediamine (En), 1,2-diaminopropane (Pn), N-ethylethylenediamine, monoethanolamine (MEA), diglycolamine (DGA), or a combination thereof.

6. The composition of claim 5, wherein the organic amine is ethylenediamine (En).

7. The composition of claim 5, wherein the organic amine is 1,2-diaminopropane (Pn).

8. The composition of claim 5, wherein the organic amine is monoethanolamine (MEA).

9. The composition of claim 5, wherein the organic amine is in an amount of from about 0.002% to about 20% by weight based on the total weight of the composition.

10. The composition of claim 1, wherein the metal inhibitor is a purine selected from guanine, xanthine, hypoxanthine, theophylline, paraxanthine, theobromine, caffeine, uric acid, adenosine, guanosine, or any combination thereof.

11. The composition of claim 1, wherein the metal inhibitor is an azole selected from 3-amino-5-methylpyrazole (3-AMP), 3-amino-1,2,4-triazole (3-ATA), 5-aminotetrazole (5-ATA), 3,5-diamino-1,2,4-triazole (3,5-ATA or guanazole), 1,2,4-triazole (TAZ), 1-amino-1,2,4-triazole, 1,2,3-triazole, 1-amino-1,2,3-triazole, 1-amino-5-methyl-1,2,3-triazole, 2,4,6-triamino-1,3,5-triazine (melamine), 1,2,4-triazole-3-carboxamide, ribavirin, 5-mercapto-1-phenyltetrazole, or any combination thereof.

12. The composition of claim 1, wherein the metal inhibitor is a pyrimidine selected from cytosine, isocytosine, folic acid, triamterene, 2-amino-4,6-dihydroxypyrimidine, 2,4-diamino-6-hydroxypyrimidine, 6-aminouracil, or any combination thereof.

13. The composition of claim 1, wherein the metal inhibitor is a thiazole or thiazolinone selected from 2-methyl-4-isothiazolin-3-one (MIT), 2-aminothiazole, 2-amino-1,3,4-thiadiazole, 1,2-benzisothiazolin-3-one (BIT), 6-acetyl-2(3H)-benzothiazolone, or any combination thereof.

14. The composition of claim 1, wherein the metal inhibitor is in an amount from about 0.001% to about 10% by weight based on the total weight of the composition.

15. The composition of claim 1, wherein the dialkylhydroxylamine is diethylhydroxylamine (DEHA).

16. The composition of claim 1, wherein:
   (a) the quaternary ammonium hydroxide is present in an amount of from about 0.05% to about 40% by weight based on the total weight of the composition,
   (b) the organic amine is present in an amount of from about 0.002% to about 20% by weight based on the total weight of the composition,
   (c) the metal inhibitor is present in an amount of from about 0.001% to about 10% by weight based on the total weight of the composition,
   (d) water is present in an amount of from about 30% to about 99.9% by weight based on the total weight of the composition; and
   (e) the pH of the composition is from about 10 to about 14.

17. A cleaning method comprising (a) providing a semiconductor wafer having contaminants resulting from chemical-mechanical polishing of the semiconductor wafer and (b) contacting the surface of the semiconductor wafer with the composition of claim 1 to remove at least some of the contaminants from the surface of the semiconductor wafer.

18. The method of claim 17, wherein the contaminants include abrasive particles, organic residue, metal ions, pad debris and CMP-byproducts, or any combination thereof.

19. The method of claim 17, wherein the wafer is a semiconducting wafer comprising metal conductors.

* * * * *